United States Patent [19]

Funakura et al.

[11] Patent Number: 5,485,114

[45] Date of Patent: Jan. 16, 1996

[54] SEMICONDUCTOR INTEGRATED CIRCUIT WITH INTERNAL COMPENSATION FOR CHANGES IN TIME DELAY

[75] Inventors: Teruhiko Funakura; Naomi Higashino, both of Itami, Japan

[73] Assignee: Mitsubishi Denki Kabushiki Kaisha, Tokyo, Japan

[21] Appl. No.: 453,107

[22] Filed: May 30, 1995

Related U.S. Application Data

[63] Continuation of Ser. No. 167,096, Dec. 16, 1993, abandoned.

[30] Foreign Application Priority Data

Dec. 17, 1992 [JP] Japan ................................. 4-354714

[51] Int. Cl.⁶ .................... H03H 11/26; H03K 1/04; H03K 17/296; H03K 17/28
[52] U.S. Cl. ................. 327/262; 327/265; 327/270; 327/271; 327/273; 327/279; 327/293; 327/395; 327/400
[58] Field of Search ..................... 327/261, 262, 327/264, 265, 266, 270, 272, 273, 274, 278, 279, 280, 285, 286, 287, 291, 293, 151, 153, 362, 395, 400, 141, 160, 161, 144

[56] References Cited

U.S. PATENT DOCUMENTS

| | | | |
|---|---|---|---|
| 4,684,897 | 8/1987 | Richards et al. | 327/362 |
| 4,845,390 | 7/1989 | Chan | 327/270 |
| 4,902,986 | 2/1990 | Lesmeister | 331/25 |
| 5,073,733 | 12/1991 | Tanno et al. | 327/261 |
| 5,087,842 | 2/1992 | Pulsipher et al. | 327/270 |
| 5,093,584 | 3/1992 | Woyke et al. | 327/291 |
| 5,175,452 | 12/1992 | Lupi et al. | 327/270 |

FOREIGN PATENT DOCUMENTS

| | | |
|---|---|---|
| 3321553 | 6/1983 | Germany . |
| 3521081 | 6/1985 | Germany . |
| 1120118 | 11/1987 | Japan . |
| 1192217 | 1/1988 | Japan . |
| 2100514 | 10/1988 | Japan . |

OTHER PUBLICATIONS

Lesmesiter, "A Densely Integrated High Performance CMOS Tester", International Test Conference, 1991, pp. 426–429.

*Primary Examiner*—Timothy P. Callahan
*Assistant Examiner*—Trong Phan
*Attorney, Agent, or Firm*—Leydig, Voit & Mayer

[57] ABSTRACT

A semiconductor integrated circuit detecting a change in the internal propagation delay and self-compensating such a change. A combination of semiconductor integrated circuits can self-compensate a change in the total propagation delay of the circuit. There is provided a ring oscillator composed of dummy device elements separate from an actually-used logic circuit portion. The oscillating pulses of the ring oscillator are counted relative to a reference pulse signal. The semiconductor integrated circuit has a delay time compensation control circuit block which generates control data used to compensate the change in the propagation delay based on the difference between the first-counted value and a subsequently counted value. In a combination of semiconductor integrated circuits, the delay time compensation control circuit block may be provided for each channel. Alternatively, the delay time compensation control circuit block may be provided for common use by many channels.

8 Claims, 21 Drawing Sheets

SEMICONDUCTOR INTEGRATED CIRCUIT WITH INTERNAL COMPENSATION FOR CHANGES IN TIME DELAY

This disclosure is a continuation of application Ser. No. 08/167,096, filed Dec. 16, 1993, now abandoned.

BACKGROUND OF THE INVENTION

1. Field of the Invention

The present invention relates to an integrated circuit comprising a plurality; of gates which are electrically connected to each other so that predetermined logical operations can be performed, and to a combination of a plurality of integrated circuits.

2. Description of the Related Art

While there are known various types of integrated circuits, a gate array will be taken in the following description as an example of an integrated circuit. However, the present invention is not limited to a gate array. Thus, it should be understood that the gate array will be taken just as an example. FIG. 21 is a block diagram illustrating a conventional gate array. In this example shown in FIG. 21, the gate array implements a decoding-type 2-input selector circuit with an output control which Operates with the synchronizing clock signal. In FIG. 21, reference numeral 1 denotes an actually-used logic circuit area which is used to implement logical functions of the gate array. There are also shown input pins 2a and 2b for receiving output control signals; input pins 3a and 3b for receiving select signals; a clock pin 4 for receiving a synchronizing signal; output pins 5a–5d for providing the output signal of the actually-used logic circuit area 1; and NAND gates 6a–6d which perform actual logical operations.

This gate array operates as follows: when both the output control signal $OE_1$ and $OE_2$ provided to the input pins 2a and 2b are at a low level, all the NAND gates 6a–6d are in an active state. In contrast, if the signal $OE_1$ is at a high level, the outputs of the NAND gates 6a and 6b are disabled. If the signal $EO_2$ is at a high level, the outputs of the NAND gates 6c and 6d are disabled. In these disabled states, the outputs of output pins 5a and 5b, or 5c and 5d are fixed to a low level regardless of the states of the other input pins 3a and 3b and the clock pin 4. Therefore, when, both signals $OE_1$ and $OE_2$ are at a low level, the output signals $Y_1$–$Y_4$ responsive to the select signals $I_1$ and $I_2$ provided to the input pins 3a and 3b may be selected. In this situation, if both select signals $I_1$ and $I_2$ are at a low level, the synchronizing signal CLK being input to the clock pin 4 will appear as the output signal $Y_1$ at the output pin 5a. If both select signals $I_1$ and $I_2$ are at a high level, the synchronizing signal CLK will appear at the output pin 5b. Similarly, if the select signal $I_1$ is at a high level and the select signal $I_2$ is at a low level, the synchronizing signal CLK will appear at the output pin 5c, and if the select signal $I_1$ is at a low level and the select signal $I_2$ is at a high level, the synchronizing signal CLK will appear at the output pin 5d.

The conventional technology regarding the gate array is also disclosed in U.S. Pat. No. 4,902,986 (Feb. 20, 1990).

In a conventional integrated circuit, such as a gate array described above as an example, the propagation delay time of the internal circuit varies due to a change in temperature or other reasons. As a result, when the output signal of an integrated circuit is used together with another signal, it is required to have a large margin including the variations in the propagation delay. Another problem is that a gate array cannot contain a circuit such as a delay circuit which must operate with high accuracy timing.

SUMMARY OF THE INVENTION

It is an object of the present invention to solve the problems described above. More specifically, it is an object of the present invention to provide an integrated circuit which can detect a change in the internal delay time and can self-compensate the change in the delay time. It is another object of the present invention to provide a combination of a plurality of integrated circuits which can detect a change in the propagation delay of the whole system and can compensate the change in the propagation delay.

To achieve the above objects, in a first aspect of the present invention, a semiconductor integrated circuit comprises a ring oscillator comprising a plurality of dummy device elements connected in the form of a ring wherein the ring oscillator is formed separately from an actual logic circuit portion and counting means for counting the oscillating pulses generated by the ring oscillator relative to a reference pulse signal.

In a second aspect of the present invention, a semiconductor integrated circuit comprises, in addition to the semiconductor integrated circuit according to the first aspect, a synchronizing clock timing compensation circuit for compensating the change in the delay time of the actual logic circuit portion; an oscillator delay control circuit for controlling the delay time of the ring oscillator;and a delay time compensation control circuit block for generating control data to be provided to the synchronizing clock timing compensation circuit and to the oscillator delay control circuit, wherein the control data is generated based on the difference between a counting value of the counting means and a reference counting value wherein the reference counting value is given as the first counting value counted by the counting means.

In a third aspect of the present invention, a semiconductor integrated circuit comprises, in addition to those included in the semiconductor integrated circuit according to the first aspect, a power-supply voltage control circuit for controlling the power-supply voltage for the actual logic circuit portion and the ring oscillator; and a delay time compensation control circuit block for generating a compensation voltage to be provided to the power-supply voltage control circuit wherein the compensation voltage is generated based on the difference between a counting value of the counting means and a reference counting value wherein the reference counting value is given as the first counting value counted by the counting means.

In a fourth aspect of the present invention, a semiconductor integrated circuit comprises, in addition to the semiconductor integrated circuit according to the third aspect, memory means for storing standard-state data associated with a standard state, a reference counting value representing the counting value provided by the counting means in the standard state, status data representing states other than the standard state, and counting values representing the compensation data from the counting means by counting in the states other than the standard state; and a delay time compensation control circuit block for generating a compensation voltage provided to the power-supply voltage control circuit, wherein the value of the compensation voltage is determined from the memory means based on the difference between the counting value of the; counting means and the reference counting value.

In a fifth aspect of the present invention, a semiconductor integrated circuit comprises, in addition to the semiconductor integrated circuit according to the second aspect, memory means for storing standard-state data associated with a standard state, a reference counting value representing the counting value provided by the counting means in the standard state, status: data representing states other than the standard state, and counting values representing the compensation data given by the counting means by performing counting in the states other than the standard state; and a delay time compensation control circuit block for generating control data provided to a synchronizing clock timing compensation circuit and to an oscillator delay control circuit wherein the control data is generated from the memory means based on the difference between the counting value of the counting means and the reference counting value.

In a sixth aspect of the present invention, a combination of semiconductor integrated circuits comprises a plurality of semiconductor integrated circuits each of which comprises an actually used logic circuit portion of the clock-synchronizing type and a series of dummy device elements wherein the actually-used logic circuit portions are connected in series, and the series of dummy device elements are connected in the form of a ring so as to form a ring oscillator; one counting means which is provided for common use by the plurality of semiconductor integrated circuits and which is arranged to count the oscillating pulses generated by the ring oscillator relative to a reference pulse signal; one synchronizing clock timing compensation circuit which is provided for common use by the plurality of semiconductor integrated circuits; one oscillator delay control circuit which is provided for common use by the plurality of semiconductor integrated circuits; one delay time compensation control circuit block which is provided for common use for the plurality of semiconductor integrated circuits, wherein the delay time compensation control circuit block is arranged to generate control data to be used to compensate for the change in the propagation delay based on the difference between the counting value of the counting means and the reference counting value which is given as the first counting value counted by the counting means.

In a seventh aspect of the present invention, a combination of semiconductor integrated circuits comprises a plurality of semiconductor integrated circuits each of which comprises an actually-used logic circuit portion, a series of dummy device elements, and a power-supply voltage control circuit wherein the actually-used logic circuit portions are connected in series, and the series of dummy device elements are connected in the form of a ring so as to form a ring oscillator; one counting means which is provided for common use by the plurality of semiconductor integrated circuits and which is arranged to count the oscillating pulses generated by the ring oscillator relative to a reference pulse signal; one delay time compensation control circuit block which is provided for common use by the plurality of semiconductor integrated circuits, Wherein the delay time compensation control circuit block is arranged to generate a compensation voltage to be used to compensate the change in the propagation delay based on the difference between the counting value of the counting means and the reference counting value which is given as the first counting value counted by the counting means.

In an eighth aspect of the present invention, a combination circuit of semiconductor integrated circuits comprises a plurality of channels each of which comprises a combination of integrated circuits according to the sixth aspect of the present invention; one counting means which is provided for common use by the plurality of channels; one memory means which is provided for common use by the plurality of channels; and one delay time compensation control circuit block which is provided for common use by the plurality of channels, wherein the delay time compensation control circuit block provides control data to respective channels so as to compensate the change in the propagation delay.

In a ninth aspect of the present invention, a combination circuit of semiconductor integrated circuits comprises a plurality of channels each of which comprises a combination of integrated circuits according to the seventh aspect of the present invention; one counting means which is provided for common use by the plurality of channels; one memory means which is provided for common use by the plurality of channels; and one delay time compensation control circuit block which is provided for common use by the plurality of channels, wherein the compensation voltages generated by the delay time compensation control circuit block are transferred separately to respective channels via the transfer means.

In the arrangement according to the first aspect of the present invention, the counting means counts the oscillating pulses generated by the ring oscillator relative to the reference pulse signal, wherein the ring oscillator is composed of dummy device elements which are provided separately from the actually-used logic circuit portion, whereby it becomes possible to detect, from the counted value, a change in the propagation delay of the semiconductor integrated circuit arising from a change in temperature or other reasons.

In the arrangement according to the second aspect of the present invention, the delay time compensation control circuit block generates the control data based on the difference between a counting value of the counting means and the reference counting value which is given as the first counting value counted by the counting means. This control data is provided to the synchronizing clock timing compensation circuit for compensating the change in propagation delay of the actually-used logic circuit portion of the clock synchronizing type, and is also provided to the oscillator delay control circuit. Thus, it becomes possible to achieve the self-compensation of the change in the propagation delay of the semiconductor integrated circuit.

In the arrangement according to the third aspect of the present invention, the delay time compensation control circuit block generates the compensation voltage based on the difference between a counting value of the counting means and the reference counting value which is given as the first counting value counted by the counting means. This compensation voltage is provided to the power-supply voltage control circuit for controlling the power-supply voltage for the actually-used logic circuit portion and the ring oscillator. Thus, it becomes possible to achieve the self-compensation of the change in the propagation delay of the semiconductor integrated circuit.

In the arrangement according to the fourth aspect of the present invention, the memory means stores the standard-state data associated with the standard state, the reference counting value representing the counting value provided by the counting means in the standard state, status data representing the states other than the standard state, and the counting values representing the compensation data given by the counting means by performing the counting in states other than the standard state. The delay time compensation control circuit block generates the compensation voltage from the above memory means, wherein the retrieving is performed based on the difference between the counting value of the counting means and the reference counting value. The generated compensation voltage is provided to the power-supply voltage control circuit. Thus, it becomes possible to achieve the optimized self-compensation of the change in the propagation delay of the semiconductor integrated circuit arising from a change in temperature or other reasons.

In the arrangement according to the fifth aspect of the present invention, the memory means stores the standard-state data associated with the standard state, the reference counting value representing the; counting value provided by the counting means in the standard state, status data representing the states other than the standard state, and the counting values representing the compensation data given by the counting means by performing the counting in states other than the standard state. The delay time compensation control circuit block generates the control data from the above memory means, wherein the retrieving is performed based on the difference between the counting value of the counting means and the reference counting value. The generated control data is provided to the synchronizing clock timing compensation circuit and the oscillator delay control circuit. Thus, it becomes possible to achieve the optimized self-compensation of the change in the propagation delay of the semiconductor integrated circuit arising from the change in temperature or other reasons.

In the arrangement according to the sixth aspect of the present invention, the delay time compensation control circuit block is provided for common use for the plurality of semiconductor integrated circuits which are connected in series, and the delay time compensation control circuit block generates the control data to be used to compensate the change in the propagation delay based on the difference between the counting value of the counting means and the reference counting value which is given is the first counting value counted by the counting means, wherein the counting means counts the oscillating pulses of the ring oscillator which is formed by connecting the series of dummy device elements of respective integrated circuits in the form of a ring. This control data is provided to the synchronizing clock timing compensation circuit which is provided for common use for the plurality of semiconductor integrated circuits, and is also provided to the oscillator delay control circuit which is provided for common use for the plurality of semiconductor integrated circuits. Thus, it becomes possible to achieve the self-compensation of the change in the propagation delay of the total combination of semiconductor integrated circuits.

In the arrangement according to the seventh aspect of the present invention, the delay time compensation control circuit block is provided for common use for the plurality of semiconductor integrated circuits which are connected in series, and the delay time compensation control circuit block generates the compensation voltage to be used to compensate the change in the propagation delay based on the difference between the counting value of the counting means and the reference counting value which is given as the first counting value counted by the counting means, wherein the counting means counts the oscillating pulses of the ring oscillator which is formed by connecting the series of dummy device elements of respective integrated circuits in the form of a ring. This compensation voltage is provided to the power-supply voltage control circuits of respective semiconductor integrated circuits. Thus, it becomes possible to achieve the self-compensation of the change in the propagation delay of the total combination circuit of semiconductor integrated circuits.

In the arrangement according to the eighth aspect of the present invention, the combination circuit of semiconductor integrated circuits comprises a plurality of channels each of which comprises a combination of integrated circuits according to the sixth aspect of the present invention; one counting means which is provided for common use by the plurality of channels; one memory means which is provided for common use by the plurality of channel; and one delay time compensation control circuit block which is provided for common use by the plurality of channel, wherein the delay time compensation control circuit block provides the control data to respective channels. Thus, it becomes possible to self-compensate the variations in the propagation delay among the channels.

In the arrangement according to the ninth aspect of the present invention, the combination circuit of semiconductor integrated circuits comprises a plurality of channels each of which comprises a combination of integrated circuits according to the seventh aspect of the present invention; one counting means which is provided for common use by the plurality of channels; one piece of memory means which is provided for common use by the plurality of channels; and one delay time compensation control circuit block which is provided for common use by the plurality of channels, wherein the compensation voltages generated by the delay time compensation control circuit block are selectively transferred to respective channels via the corresponding transfer means. Thus, it becomes possible to self-compensate the variations in the propagation delay among the channels.

DESCRIPTION OF THE PREFERRED EMBODIMENTS

Preferred embodiments according to present invention will be described below taking a gate array as an example of an integrated circuit. However, the present invention is not limited to a gate array, and it should be understood that the gate array will be taken just as an example.

EMBODIMENT 1

Figure 1:
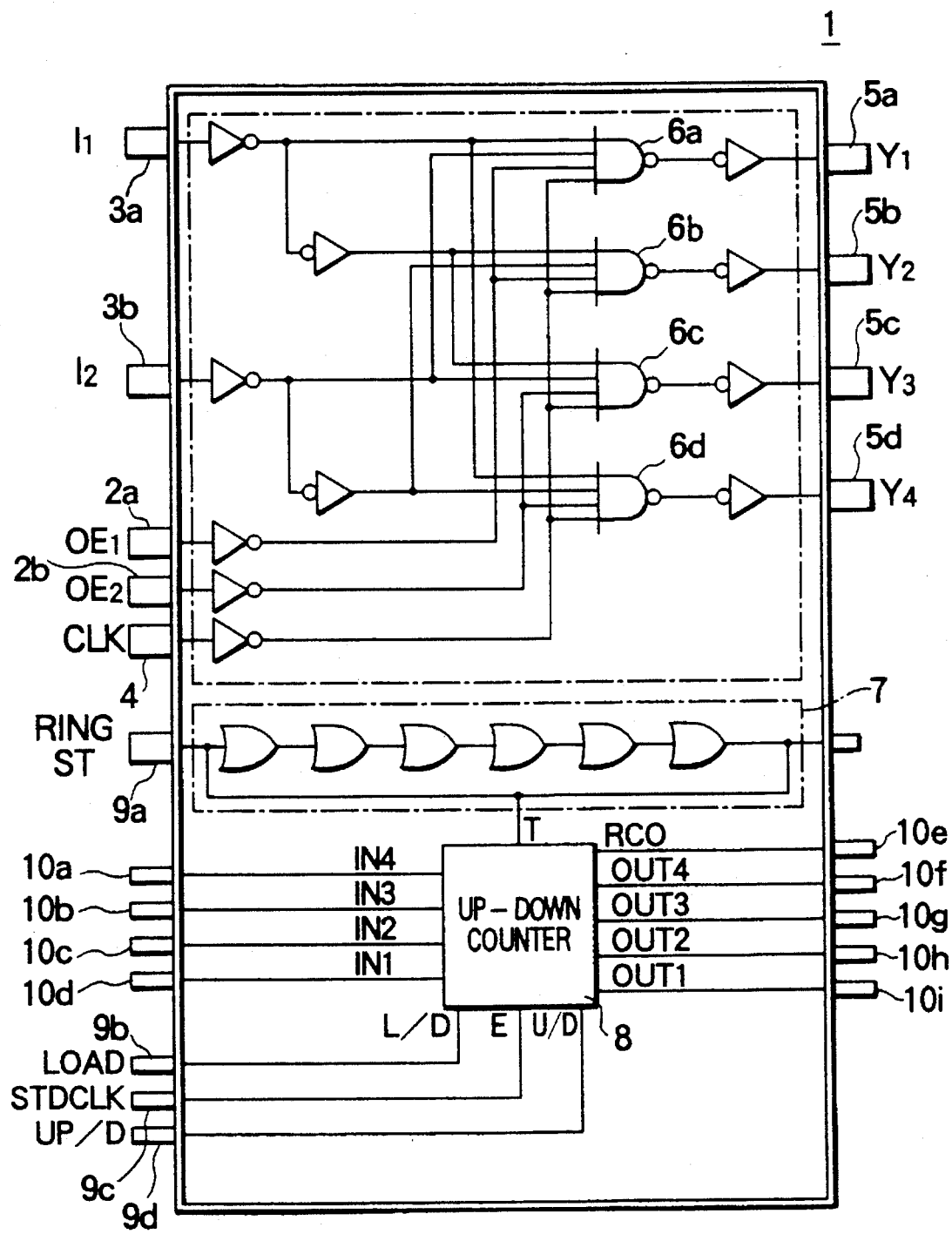
FIG. 1 is a block diagram illustrating a semiconductor integrated circuit according to a first embodiment of the present invention.
Figure 21:
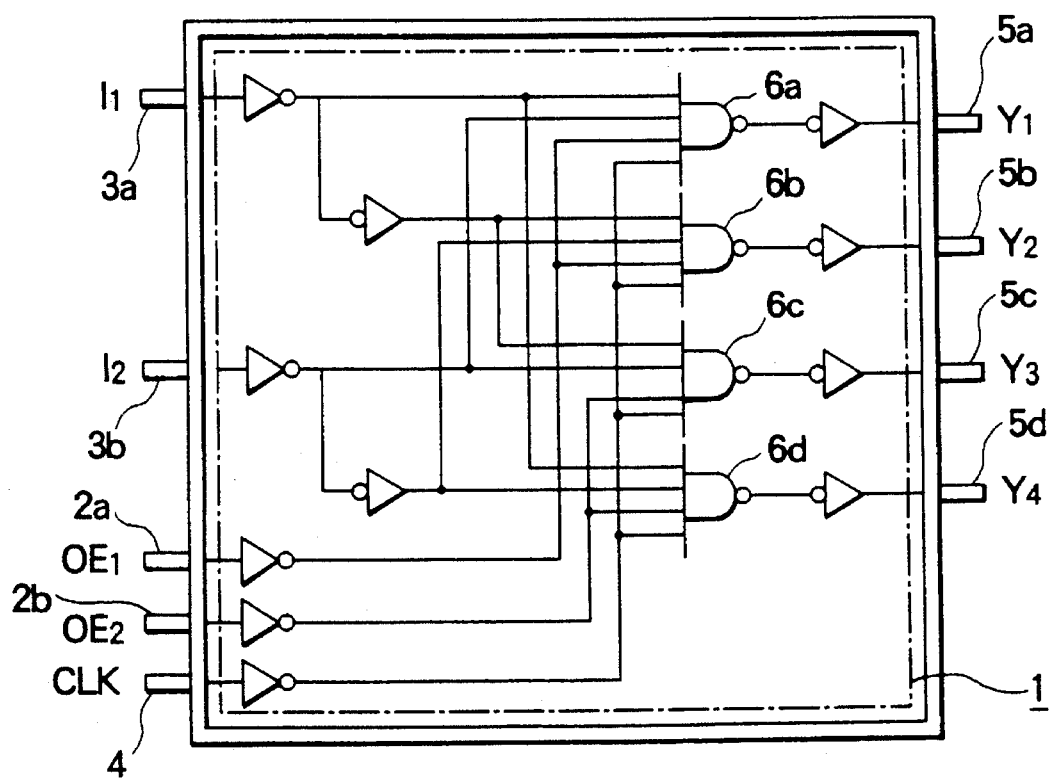
FIG. 21 is a block diagram illustrating a conventional semiconductor integrated circuit.

FIG. 1 is a block diagram showing a semiconductor integrated circuit according to the first aspect of the present invention, in which the elements corresponding to those in FIG. 21 are denoted by the same reference numerals and explanation on those elements will not be repeated. In FIG. 1, reference numeral 7 denotes a ring oscillator comprising dummy gates connected in series in the form of a ring which are provided separately from the actual logic circuit portion 1, and reference numerals 8 denotes an up-and-down counter serving as counting means for counting the oscillation pulses of the ring oscillator 7. In FIG. 1, there are also shown input pins 9a–9d for inputting various signals; input pins 10a–10d for inputting the setting data for the up-and-down counter 8; and output pins 10e–10i for outputting the counted data of the up-and-down counter 8.

Now, the operation of this integrated circuit will be described below. The actual logic circuit portion 1 is the same as that in FIG. 21 which has been already explained and will not be explained again here. In the ring oscillator 7 shown in FIG. 1, if a single pulse signal RINGST is input via the input pin 9a, then the signal will be circulated through the series of the dummy device elements or dummy gates connected in the form of a ring, and the signal circulation or oscillation will be continued. If this series of the dummy gates is formed by using the same number of gates as the number of gates provided between the input and the output of the actual logic circuit portion 1, and by using the same type of gates used in the actual logic circuit portion 1, then the pulse interval of the ring oscillator will be approximately equal to the delay time between the input and output of the actual logic circuit portion 1.

The oscillating pulses of the ring oscillator 7 are applied to the up-and-down counter 8. The operation mode of the up-and-down counter 8 is determined by the input signal U/D provided via the input pin 9d so that the up-and-down counter 8 operates either in the up-counting mode or in the down-counting mode. In the down-counting mode, an initial value is first loaded via the input pins 10a–10d responsive of the load signal L/D, then from this initial value, the oscillating pulses are counted down to zero. When the count reaches zero, the signal RCO is output from the output pin 10e. In the case of up-counting mode, a counted value will be output via the output pins 10f–10i. If a high accuracy reference pulse signal STDCLK acting as an enable signal is applied via the input pin 9 to the up-and-down counter 8, then the oscillating pulses of the ring oscillator 7 are counted only when the reference pulse signal is at a high level.

Figure 2:
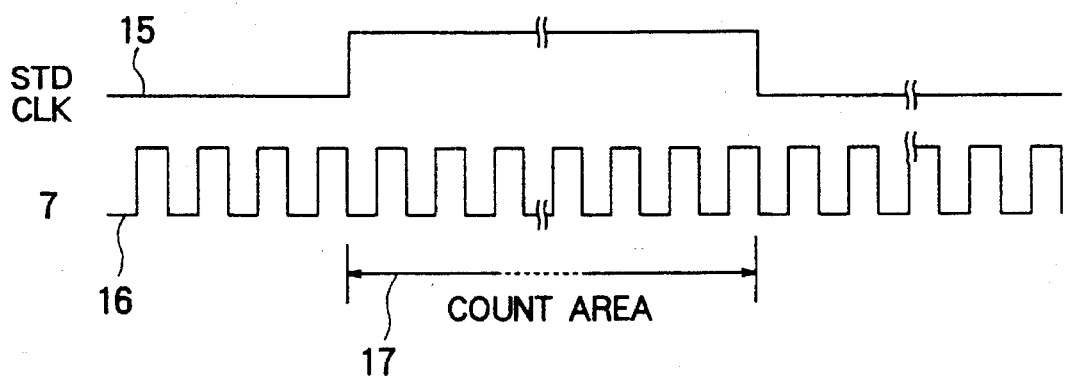
FIG. 2 is a timing chart showing the timing of the internal operations of the first embodiment.

FIG. 2 is a timing chart illustrating the operation of the above-described integrated circuit, wherein reference numeral 15 denotes the reference pulse signal (STDCLK), and reference numeral 16 denotes the oscillating pulses of the ring oscillator 7. As can be seen from FIG. 2, the number of the oscillating pulses of the ring oscillator 7 is counted for a time period (denoted by 17 in FIG. 2) during which the STDCLK signal 15 is at a high level. If the STDCLK signal 15 has high enough accuracy and if the STDCLK signal 15 is not affected by the change in the internal delay of the gate array, then the change in the internal delay of the gate array yields the difference in the humbler of pulses counted during the time period 17. If the counted number is large, then this means that the delay time is short, and if the counted number is small, then this means that the delay time is long.

EMBODIMENT 2

Figure 3:
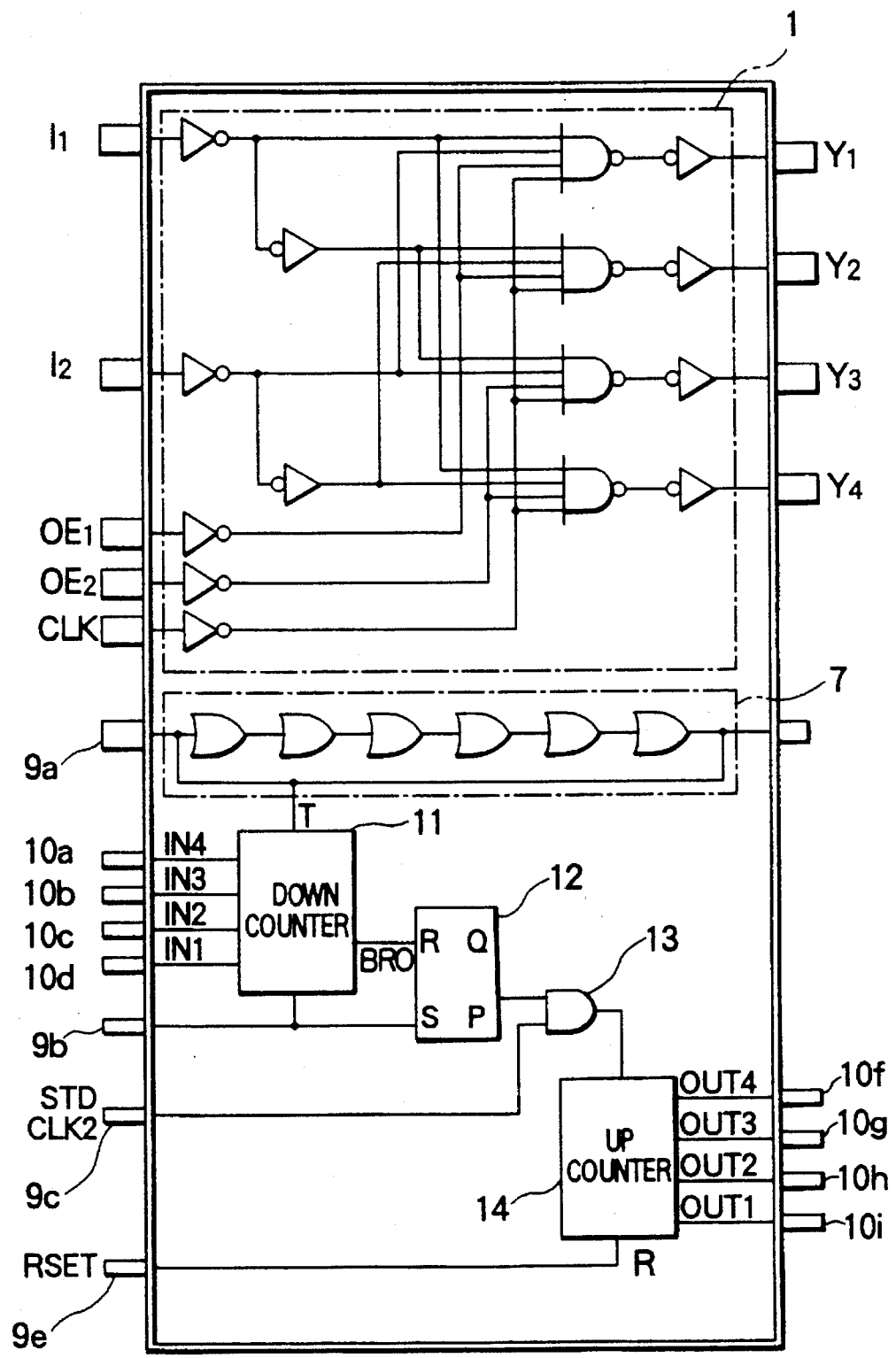
FIG. 3 is a block diagram illustrating a semiconductor integrated circuit according to a second embodiment of the present invention.

Referring to figures, a second embodiment according to the present invention will be described below. FIG. 3 is a block diagram illustrating another embodiment according to the first aspect of the present invention. In this figure, reference numeral 11 denotes a down counter serving as counting means for counting the oscillation pulses of the ring oscillator 7, and reference numeral 12 a set-reset flip-flop (RS flip-flop) for generating a gate signal from the output of the down counter 11. In FIG. 3, there are also shown an AND gate 13 which is opened or closed by the gate signal provided by the flip-flop 12; the AND gate 13 and an up counter 14 serving as counting means for counting a reference pulse signal, that is, a reference clock STDCLK 2 which has passed through the AND gate 13; and to an input pin 9e for inputting a reset signal RESET for the up counter 14. The other elements are denoted by the same reference numerals as the corresponding elements in FIG. 1, and the explanation of these elements will not be repeated.

The operation of this integrated circuit will be described below. The input value, is provided to the down counter 11 via the input pins 10a–10d responsive to a load signal L/D provided via the input pin 9b. Using this as the initial value, the down counter 11 counts the number of oscillating pulses of the ring oscillator 7. At the same time, the load signal L/D is also provided to the set terminal S of the flip-flop 12 via the input pin 9b so that the inverted output P of the flip-flop 12 goes to a high level. This output P is provided to the input of the AND gate 13.

Figure 4:
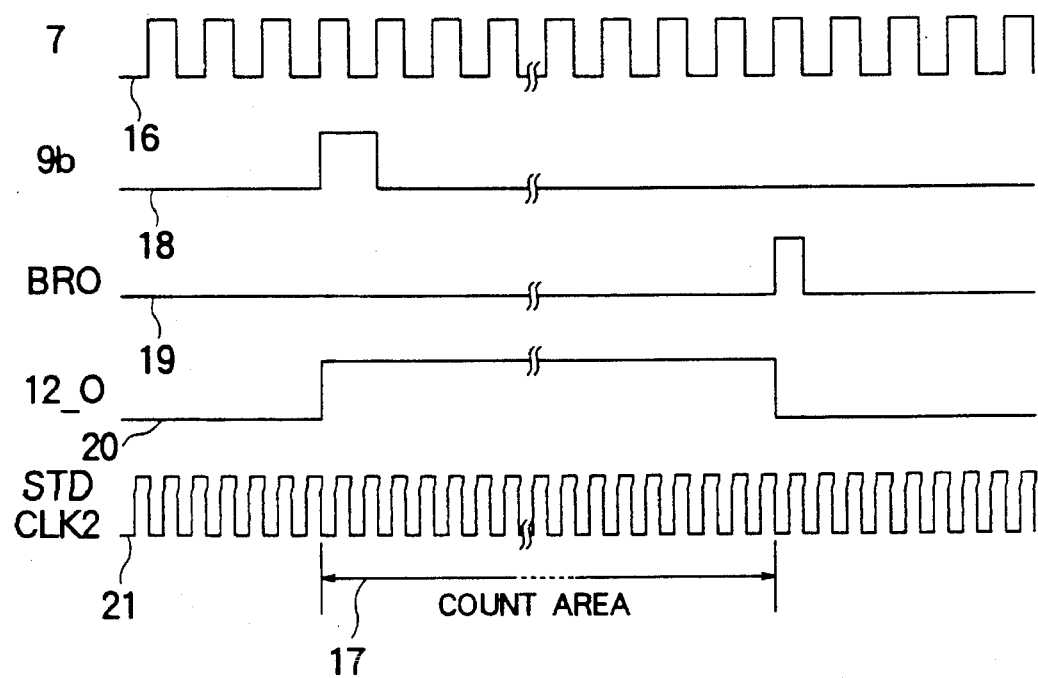
FIG. 4 is a timing chart showing the timing of the internal operations of the second embodiment.

FIG. 4 is a timing chart illustrates the operation of the above-described integrated circuit. In this figure, there are shown an oscillating pulse signal 16 of the ring oscillator 7;

the load signal 18 applied to the input pin 9b; and a borrow signal 19 output by the down counter 11. In FIG. 4, reference numeral 20 denotes the inverted output P of the flip-flop, and reference numeral 21 denotes the reference clock signal (STDCLK 2) serving as the reference pulse signal applied to the input pin 9c. When the count reaches zero after the down counter starts counting down, the down counter provides the borrow signal to the reset terminal R of the flip-flop 12, whereby the inverted output P of the flip-flop 12 goes to a low level. Therefore, the AND gate 13 is in an active state for a time period from the time When the load signal is applied to the input pin 9b to the time when the flip-flop 12 generates the borrow signal. During this active state period, the up counter 14 counts the signal STDCLK 2 which is applied to the counter 14 via the input pin 9c and via the AND gate 13. If the pulse signal STDCLK 2 has a high enough frequency, it is possible to obtain high resolution in the detection of a change in the internal delay of the integrated circuit.

EMBODIMENT 3

Figure 5:
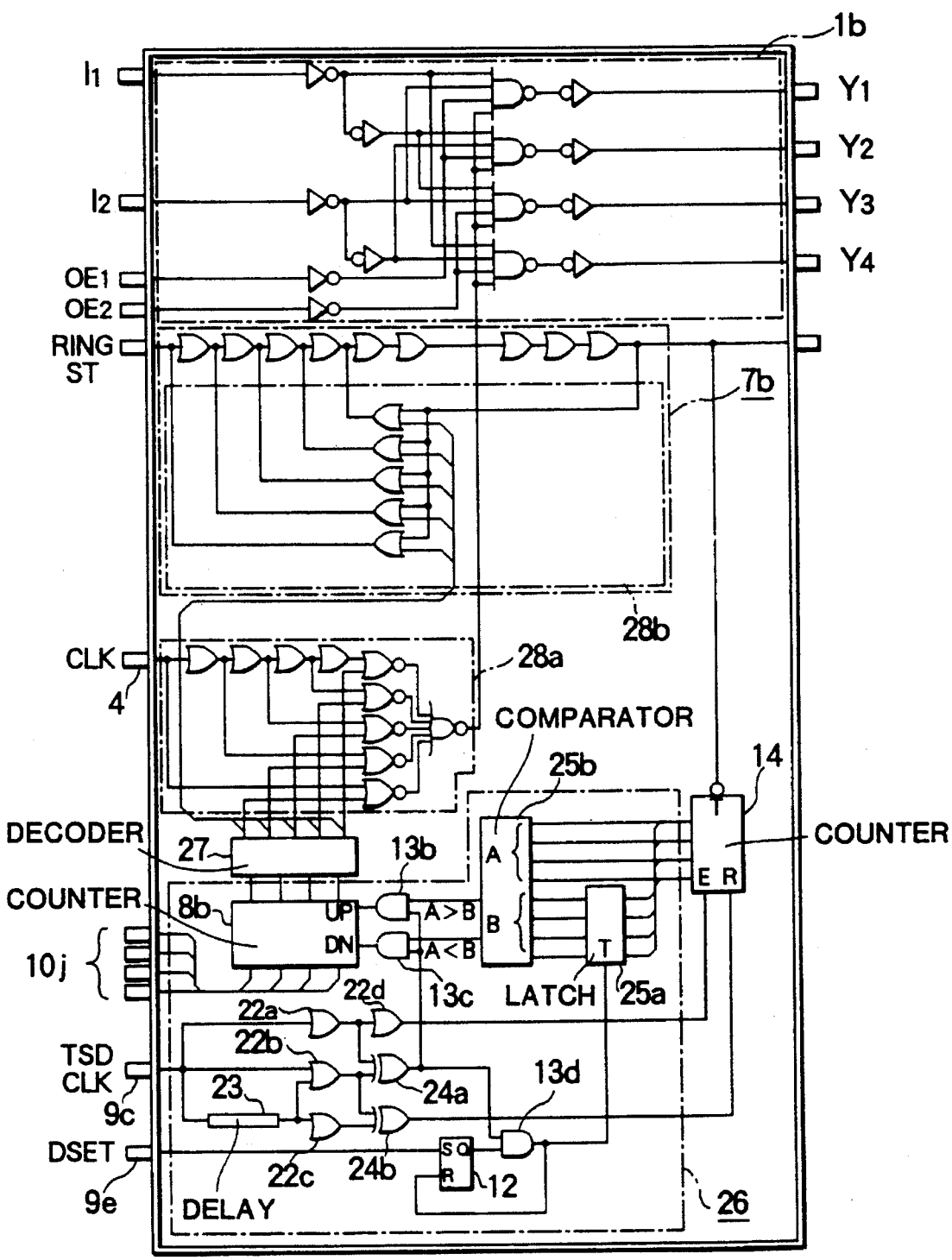
FIG. 5 is a block diagram illustrating a semiconductor integrated circuit according to a third embodiment of the present invention.

FIG. 5 is a block diagram showing a third embodiment according to the second aspect of the present invention. The elements corresponding to those in FIG. 1 or 3 are denoted by the same reference numerals, and these elements will not be explained again below. In FIG. 5, reference numeral 1b denotes an actual logic circuit portion which operates with the synchronizing clock, and reference numeral 8b denotes an up-and-down counter having separate clock inputs for up counting operation and down counting operation. There are also shown input pins 10j via which an initial value is input to the up-and-down counter 8b; an input pin 9e via which a control signal DSET used to set the initial data is supplied; AND gates 13b–13d for controlling application of signals to the up down counter 8b and the latch 25a; OR gates 22a–22d for controlling operation of the latch 25a and the up and down counter 8b; a delay circuit 23; EXCLUSIVE-OR gates 24a–24b for controlling operation of the latch 25a and up counter 14; a latch 25a for latching the content of the up counter 14; and digital comparator 25b serving as comparison means for comparing the content of the up counter 14 with the content of the latch 25a. A delay compensation control block 26 is formed with the up-and-down counter 8b, the flip-flop 12, the AND gates 13b–13d, the OR gates 22a–22d, the delay circuit 23, the EXCLUSIVE-OR gates 24a–24b, the latch 25a, and the digital comparator 25b. In FIG. 5, there are also shown a decoder 27 for decoding the value counted by the up-and-down counter 8b; a synchronizing clock timing compensation circuit 28a for compensating the delay time by controlling the timing of the synchronizing clock for the actual logic circuit portion 1b; and an oscillator delay control circuit 28b for controlling the dummy gates of the ring oscillator in correspondence with the control of the synchronizing clock timing compensation circuit 28a. The ring oscillator 7b differs the ring oscillator 7 shown in FIG. 1 in that the ring oscillator 7b includes the oscillator delay control circuit 28b.

Figure 6:
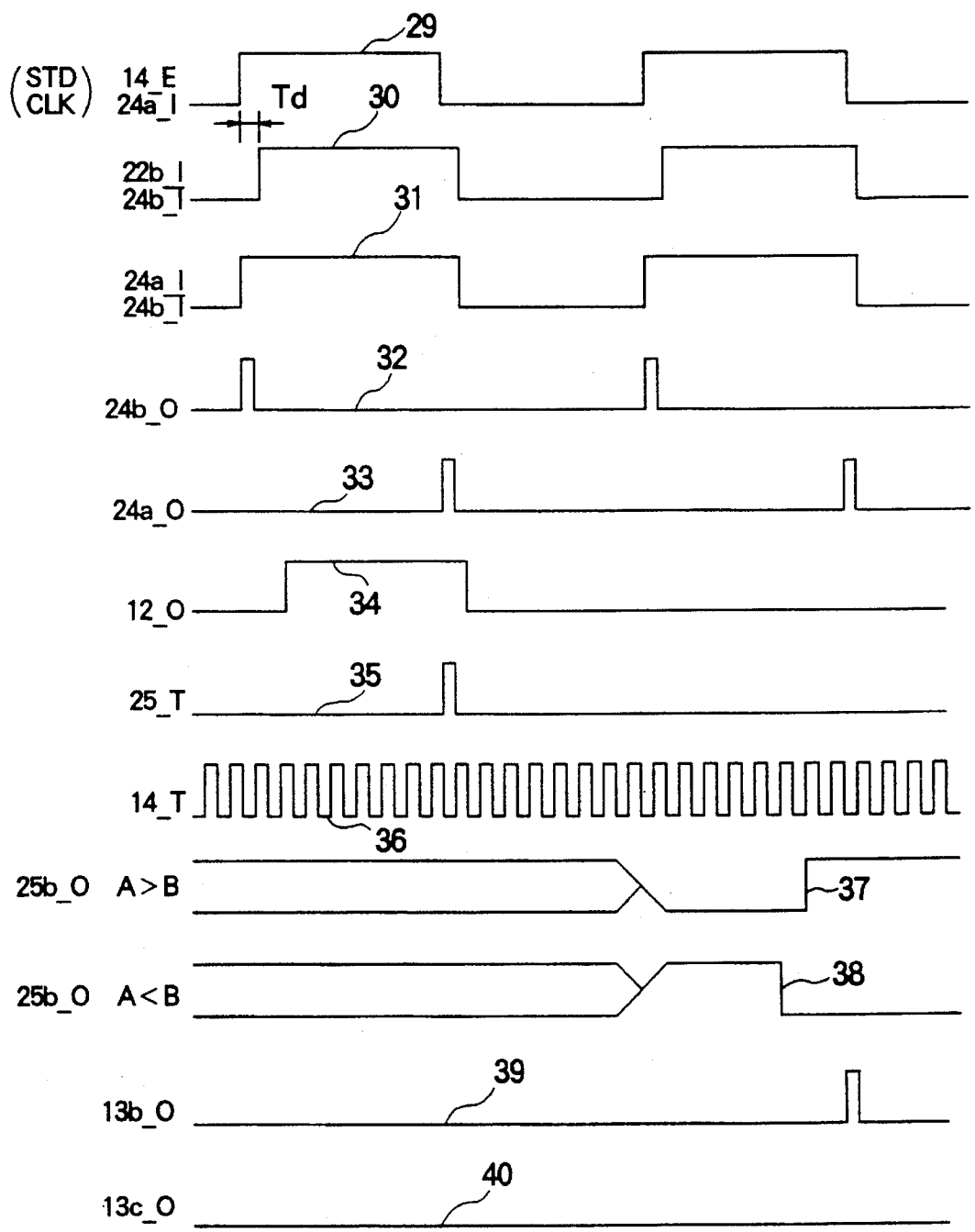
FIG. 6 is a timing chart showing the timing of the internal operations of the third embodiment.

FIG. 6 is a timing chart illustrating the operation of this integrated circuit. In the FIG. 6, reference numeral 29 denotes the reference signal STDCLK 29 applied to the input pin 9c. Reference numeral 30 denotes the input signal applied to the enable input of the up counter 14 and also to the EXCLUSIVE-OR gate 24a, Reference numeral 30 denotes the signal which is obtained by delaying the reference signal STDCLK 29 with the delay circuit 23 and which is applied to the input of the OR gate 22b and to the input of the EXCLUSIVE-OR gate 24b. Reference numeral 31 denotes the output of the EXCLUSIVE-OR gate 22b which is applied to the input of the EXCLUSIVE-OR gates 24a and 24b. Reference numeral 32 denotes the output of the EXCLUSIVE-OR gate 24b Which is applied as the reset signal to the up counter 14. Reference numeral 33 is the output of the EXCLUSIVE-OR gate 24a which is applied to the respective inputs of the AND gates 13b, 13c, and 13d. Reference numeral 34 denotes the output signal of the flip-flop 12 which is responsive to the signal DSET applied via the input pin 9e wherein the signal DSET is used as the control signal to set the initial data. Reference numeral 35 denotes the output of the AND gate 13d serving as the trigger signal to the latch 25a. Reference numeral 36 denotes the oscillating pulses of the ring oscillator 7b which is applied as the clock signal to the up counter 14. Reference numeral 37 denotes the output signal of the digital comparator 25b when A> B, and reference numeral 38 denotes the output signal of the digital comparator 25b when A< B. Reference numeral 39 denotes the output signal of the AND gate 13b which controls the counting value of the up-and-down counter 8b responsive to the result of the comparison mode in the digital comparator 25b. Reference numeral 40 denotes the output signal of the AND gate 13c.

The operation is performed as follows. If the STDCLK signal with high accuracy is applied to the input pin 9c as shown in FIG. 6, then the delay circuit 23 provides the output signal delayed from the STDCLK signal by the delay time Td as denoted by reference numeral 30 in FIG. 6. The OR gate 22b receives both these signals, and provides the output signal as shown by reference numeral 31 in FIG. 6. In the actual circuit, there are provided OR gates 22a, 22c and 22d which are used as dummy gates to adjust the timing, however these OR gates are neglected in the timing chart of FIG. 6. Thus, the EXCLUSIVE-OR gates 24a and 24b provide the output signals denoted respectively by reference numerals 32 and 33 in FIG. 6. To detect the initial reference counting value, the selects of the synchronizing clock timing compensation circuit 28a and the oscillator delay control circuit 28b in the actual logic circuit portion 1b are reset with the value applied via the input pins 10j, and the DSET signal is input via the input pin 9c.

The up counter 14 is reset by the output signal of the EXCLUSIVE-OR gate 24b denoted by reference numeral 32 in FIG. 6. The oscillating pulses 36 of the ring oscillator 7b are counted by the up counter 14 from zero, only for a time period during which the STDCLK signal 29 is at a high level. In this state, if the control signal DSET for setting the initial data is applied to the input pin 9c, then the logic level of the non-inverted output Q of the RS flip-flop 12 becomes high, and only the pulse shown by reference numeral 33 in FIG. 6 passes through the AND gate 13d and will appear as the output signal 35 at the outpost of the AND gate 13d. Responsive to this signal 35, the latch 25a latches the counting value of the up counter 14. This first latched value is applied as the reference counting value to the B-data inputs of the digital comparator 25b. In the operation after that, the oscillating pulses of the ring oscillator 7b are counted only for a time duration during which the STDCLK signal 29 is at a high level, and the resulting counted value is applied to A-data inputs of the digital comparator 25b.

The digital comparator 25b compares the current counting value, data A, with the reference counting value, data B, and the comparison result is output as shown by reference numeral 37 or 38 in FIG. 6. In the case where the current counting value is larger than the reference counting value, the pulse signal 39 is applied to the up-counting input of the up-and-down counter 8b at the time when the counting is completed, wherein this counting completion time is denoted by reference numeral 33 in FIG. 6. By this pulse signal 39, the up-and-down counter 8b is counted up, and the output of the up-and-down counter 8b is applied to the decoder 27. Based on the counting value of the up-and-down counter 8b, the decoder 27 selects a proper number of gates of the synchronizing clock timing compensation circuit 28a so that the synchronizing clock for the actual logic circuit portion 1b may be delayed by a proper amount. For example, in the case described above where the current counting value is larger than the reference counting value, it can be understood that the internal operation of the actual logic circuit portion 1b is too fast as a whole. Therefore, to make compensation, the number of gates of the synchronizing clock timing compensation circuit 28a is increased, and the number of gates of the oscillator delay control circuit 28b is also increased so that the number of gates of the oscillator delay control circuit 28b becomes the same as or corresponding to that of the synchronizing clock timing compensation circuit 28a.

The self-compensation is performed by repeating the operations described above so that the counting value of the oscillating pulses of the ring oscillator 7b may be the same as the initial reference value.

EMBODIMENT 4

Figure 7:
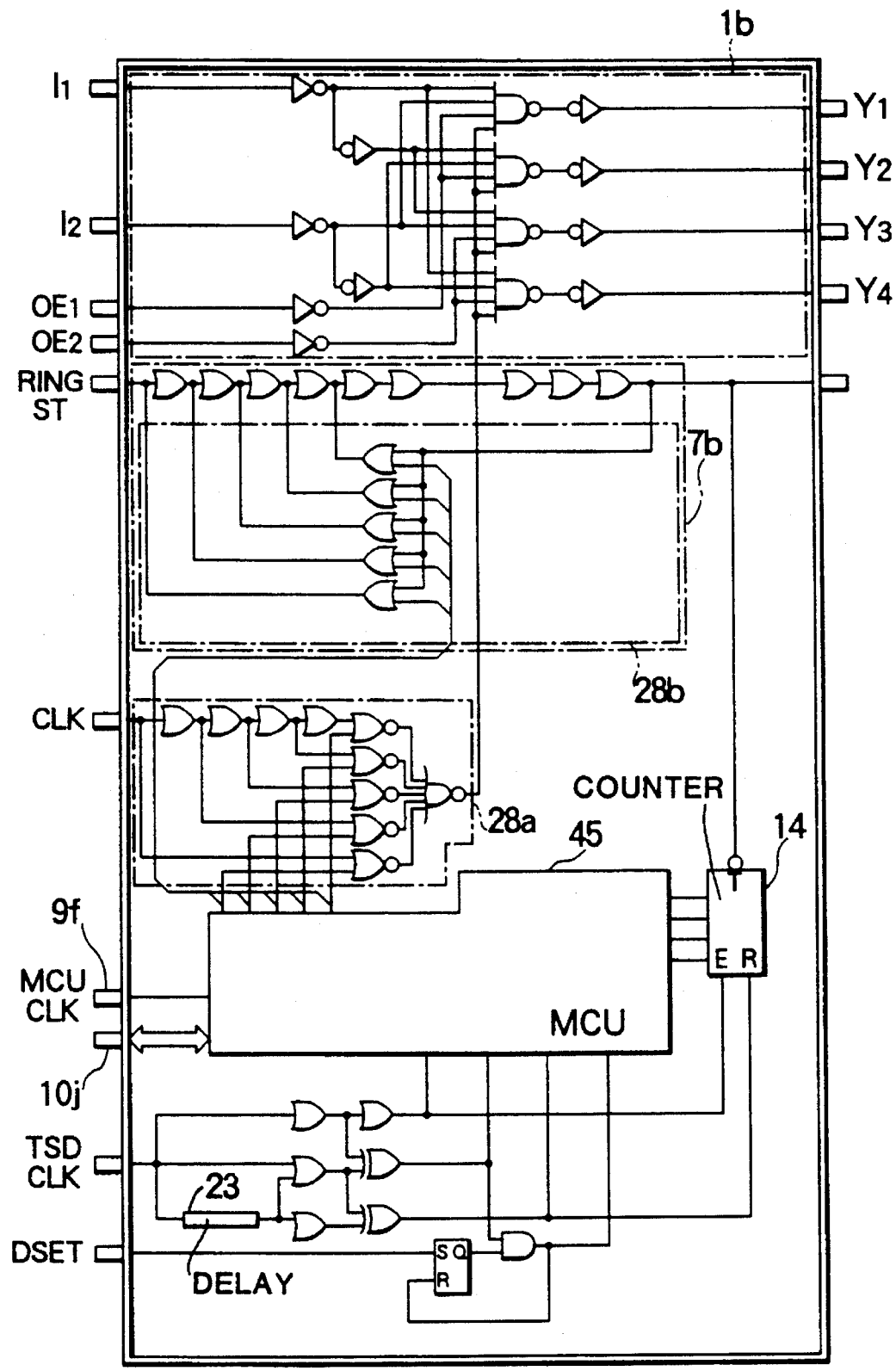
FIG. 7 is a block diagram illustrating a semiconductor integrated circuit according to a fourth embodiment of the present invention.

Referring to FIG. 7, a fourth embodiment according to the present invention will be described below. FIG. 7 is a block diagram illustrating another embodiment according to the second aspect of the present invention. In this embodiment, various control circuits of Embodiment 3 shown in FIG. 5, such as the AND gates 13b, 13c, latch 25a, digital comparator 25b, decoder 27, and up-and-down counter 8b are replaced with a microcomputer (MCU) 45 so that an operation similar to that in FIG. 5 may be achieved. In this specific embodiment, the MCU 45 is contained in the same package as the actual logic circuit portion 1b, however, these may be housed in different packages. One specific example of the MCU 45 is M37702.

EMBODIMENT 5

Figure 8:
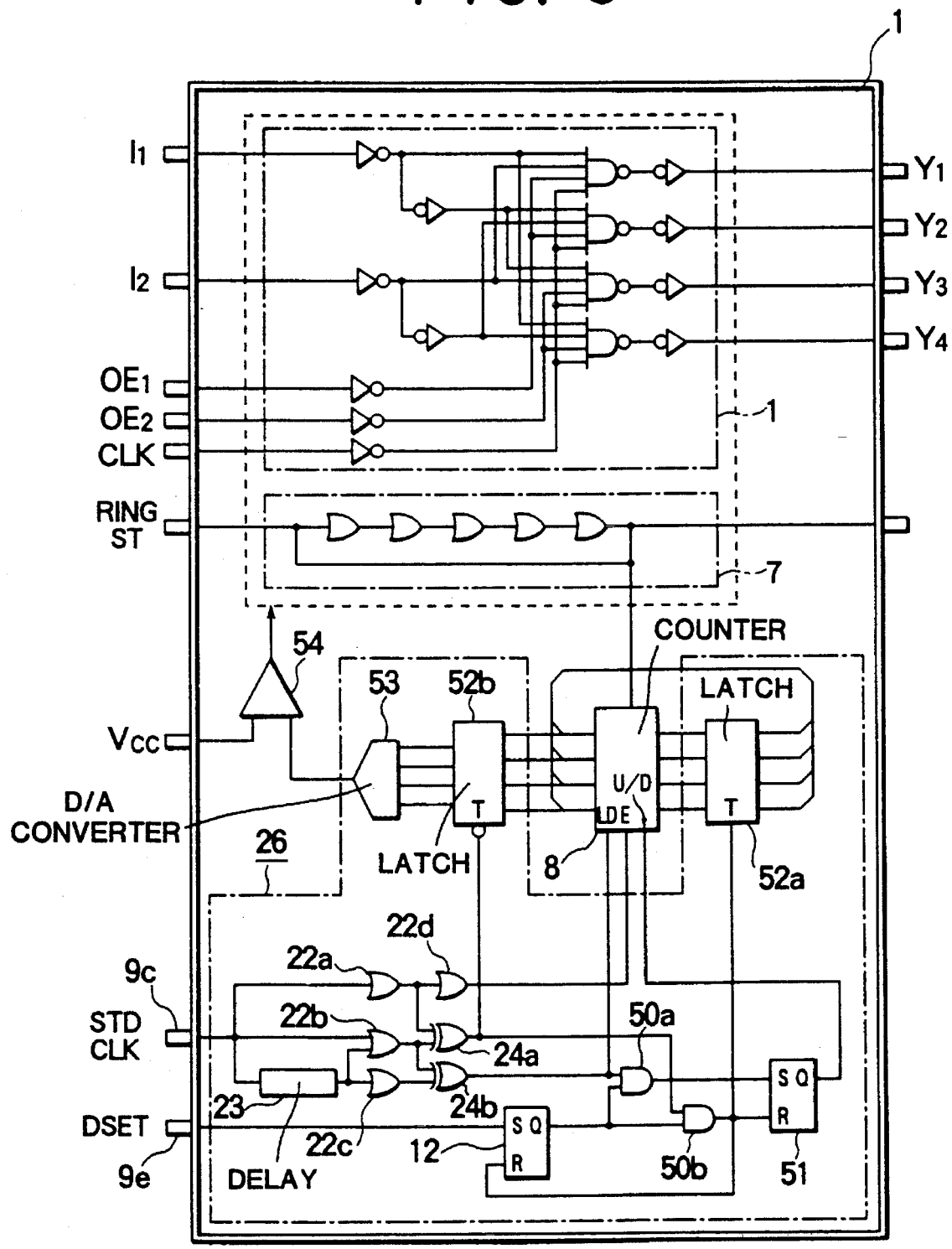
FIG. 8 is a block diagram illustrating a semiconductor integrated circuit according to a fifth embodiment of the present invention.

FIG. 8 is a block diagram showing a fifth embodiment according to the third aspect of the present invention. The elements corresponding to those in the previous embodiments will not be described again. In FIG. 8, reference numerals 50a and 50b denote AND gates used to generate an up-and-down control signal for the up-and-down counter 8; reference numeral 51 denotes an RS flip-flop which is also used to generate an up-and-down control signal for the up-and-down counter 8; reference numeral 52a denotes a latch for latching the reference value of the up-and-down counter 8; reference numeral 52b denotes a latch for latching the residual counting-down value; reference numeral 53 denotes a D/A converter for generating a voltage based on the data latched in the latch 52b; and reference numeral 54 denotes an operational amplifier for providing an output voltage equal to the sum of the output of the D/A converter 53 and a supply voltage Vcc.

Figure 9:
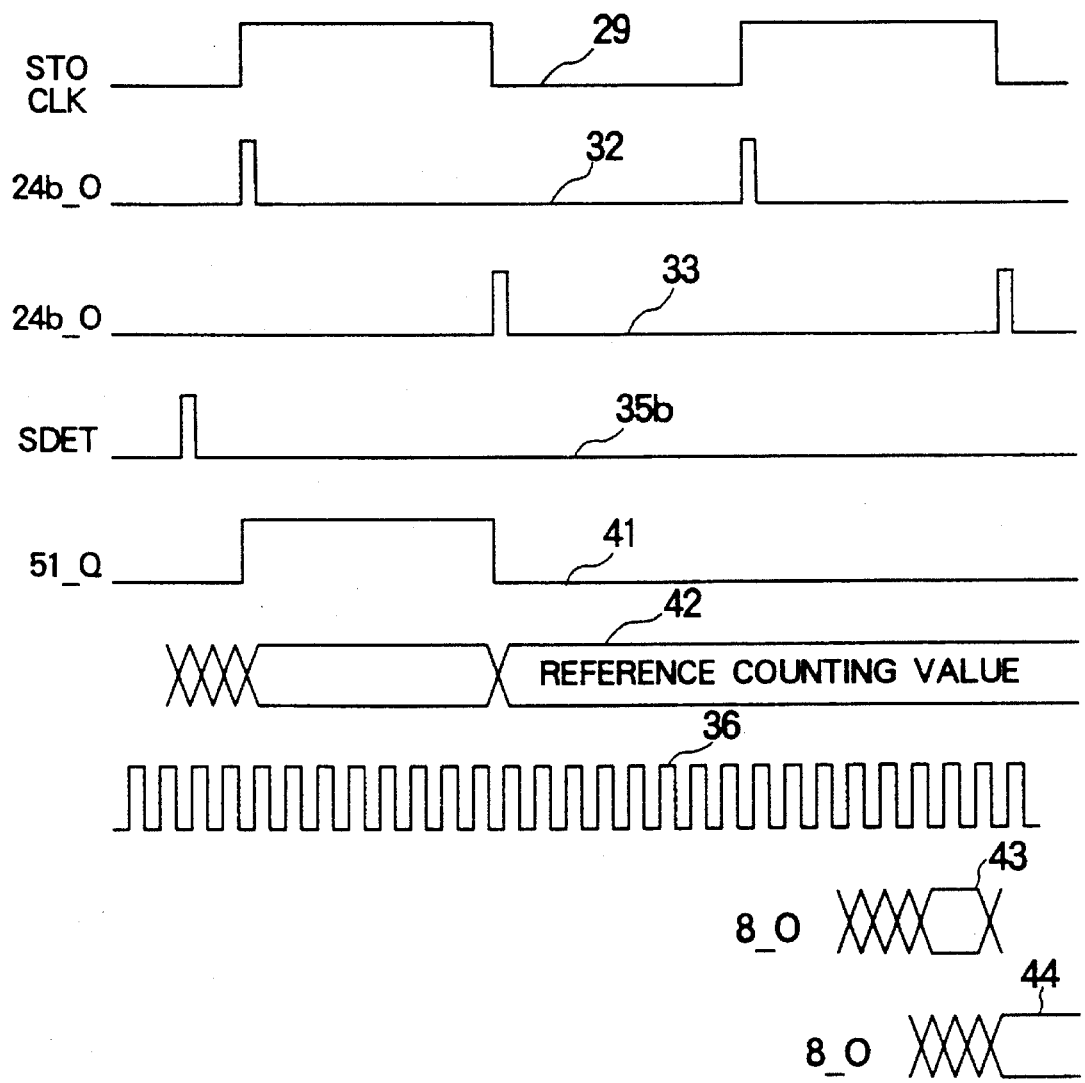
FIG. 9 is a timing chart showing the timing of the internal operations of the fifth embodiment.

In FIG. 9, reference numeral 35b denotes a DSET signal applied to the input pin 9e; reference numeral 41 denotes a non-inverted output Q of the flip-flop 51; reference numeral 42 denotes a counting-up value of the up-and-down counter 8; reference numeral 43 denotes a count-down value of the up-and-down counter 8; and reference numeral 52 denotes a residual counting-down value latched in the latch 52b.

The operation of this embodiment will be described below. Referring to FIG. 8, when the initial counting value is detected, the control signal DSET 35b for setting the initial data is applied to the input pin 9e in the timing shown by 35b in FIG. 9. This DSET signal 35b is applied to the set terminal S of the flip-flop 12, whereby the logic level of the non-inverted output Q of the flip-flop 12 becomes high and the AND gates 50a and 50b become active. In this state, a signal is output by the EXCLUSIVE-OR gate 24b in synchronization with the STDCLK signal 29. If the signal denoted by reference numeral 32 in FIG. 9 is input to the AND gate 50a, then this signal passes through the AND gate 50a and is applied to the set terminal S of the flip-flop 51. As a result, the non-inverted output Q of the flip-flop 51 goes to a high level. Then, a signal denoted by reference numeral 33 in FIG. 9 passes through the AND gate 50b which is in an active state, and is applied to the reset terminal R of the flip-flop 51, whereby the non-inverted output Q of the flip-flop 51 goes to a low level, as shown by reference numeral 41 in FIG. 9. At the same time, this signal from the AND gate 50a forces the output Q of the flip-flop 12 to go to a low level, and thus the AND gates 50a and 50b are closed.

When the signal denoted by reference numeral 41 in FIG. 9 is at a high level, the up-and-down counter 8 is counted up, and the oscillating pulses 36 of the ring oscillator 7 are counted until both the signal 41 and the STDCLK signal 29 become low. The counting value of the up-and-down counter 8 is latched by the latch 52. This latched data is used as the reference counting value shown by 42 in FIG. 9.

When the DSET signal 35b is not being input, the up-and-down counter 8 counts down the oscillating pulses 36 of the ring oscillator 7 from the reference counting value for a time period during which the STDCLK signal 29 is at a high level. The residual counting-down value shown by reference numeral 44 in FIG. 9 is latched temporarily by the latch 52, and then is applied to the D/A converter 53 as a digital input value as shown by 44 in FIG. 9. The D/A converter 53 provides a compensation voltage to the operational amplifier 54 wherein the compensation voltage corresponds to the latched data 44 representing the residual counting-down value latched by the latch 52b. The operational amplifier 54 adds the compensation voltage provided by the D/A converter 53 to the power-supply voltage Vcc, and the resulting added voltage is supplied as a power-supply voltage to the actual logic circuit portion 1b and to the ring oscillator 7.

For example, if the ambient temperature becomes higher than that at which the reference counting value was detected, and thus if the operation speed of the actual logic circuit portion 1b becomes slower, then the residual counting-down value shown by reference numeral 43 in FIG. 9 will become larger, and thus the output voltage of the D/A converter 59 will become larger by an amount corresponding to an increase in the residual counting-down value. This causes an increase in the compensation voltage which is output by the operation amplifier 54. As a result, the power-supply voltage supplied to the actual logic circuit portion 1b and to the ring oscillator 7 becomes higher. In a CMOS circuit, for example, if a power-supply voltage becomes higher, then the operation speed generally becomes higher. Therefore, the operation speed of the ring oscillator 7 also becomes higher, and the number of pulses which are output during a fixed time will increase. Due to the increase in the number of pulses, the residual counting-down value 43 decreases to a value which is the same as or close to the reference counting value.

EMBODIMENT 6

Figure 10:
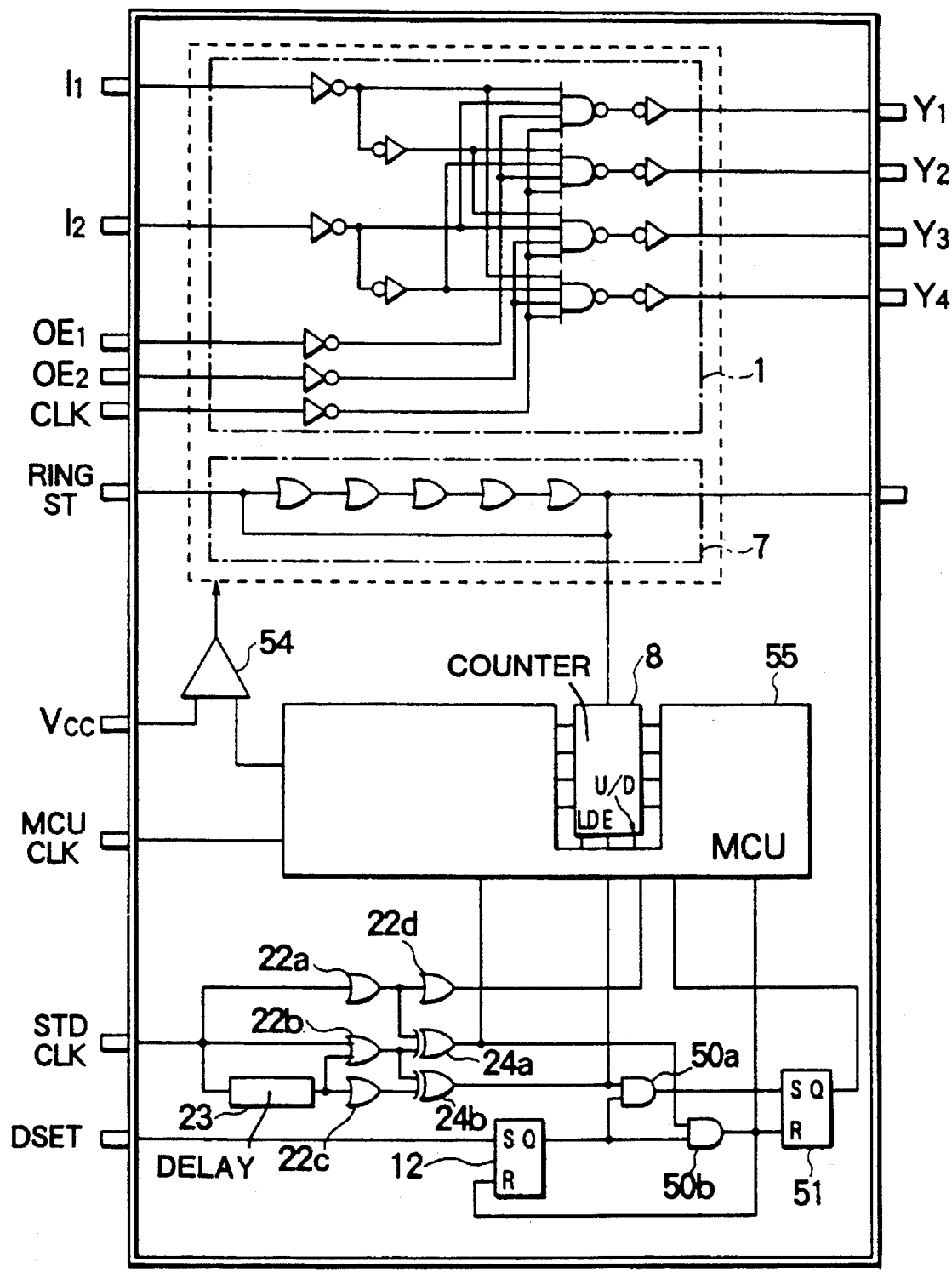
FIG. 10 is a block diagram illustrating a semiconductor integrated circuit according to a sixth embodiment of the present invention.

A sixth embodiment according to the present invention will be described below. FIG. 10 is a block diagram illustrating another embodiment according to the third aspect of the present invention. In this embodiment, various control circuits of Embodiment 5 shown in FIG. 8, such as the latches 52a, 52b, and the D/A converter 53 are replaced with a microcomputer MCU 55 comprising for example M37702 or the like so that the operation similar to that in FIG. 8 may be achieved. In this specific embodiment, the MCU 55 is contained in the same package as the actual logic circuit portion 1b, however, these may be housed in different packages.

EMBODIMENT 7

Figure 11:
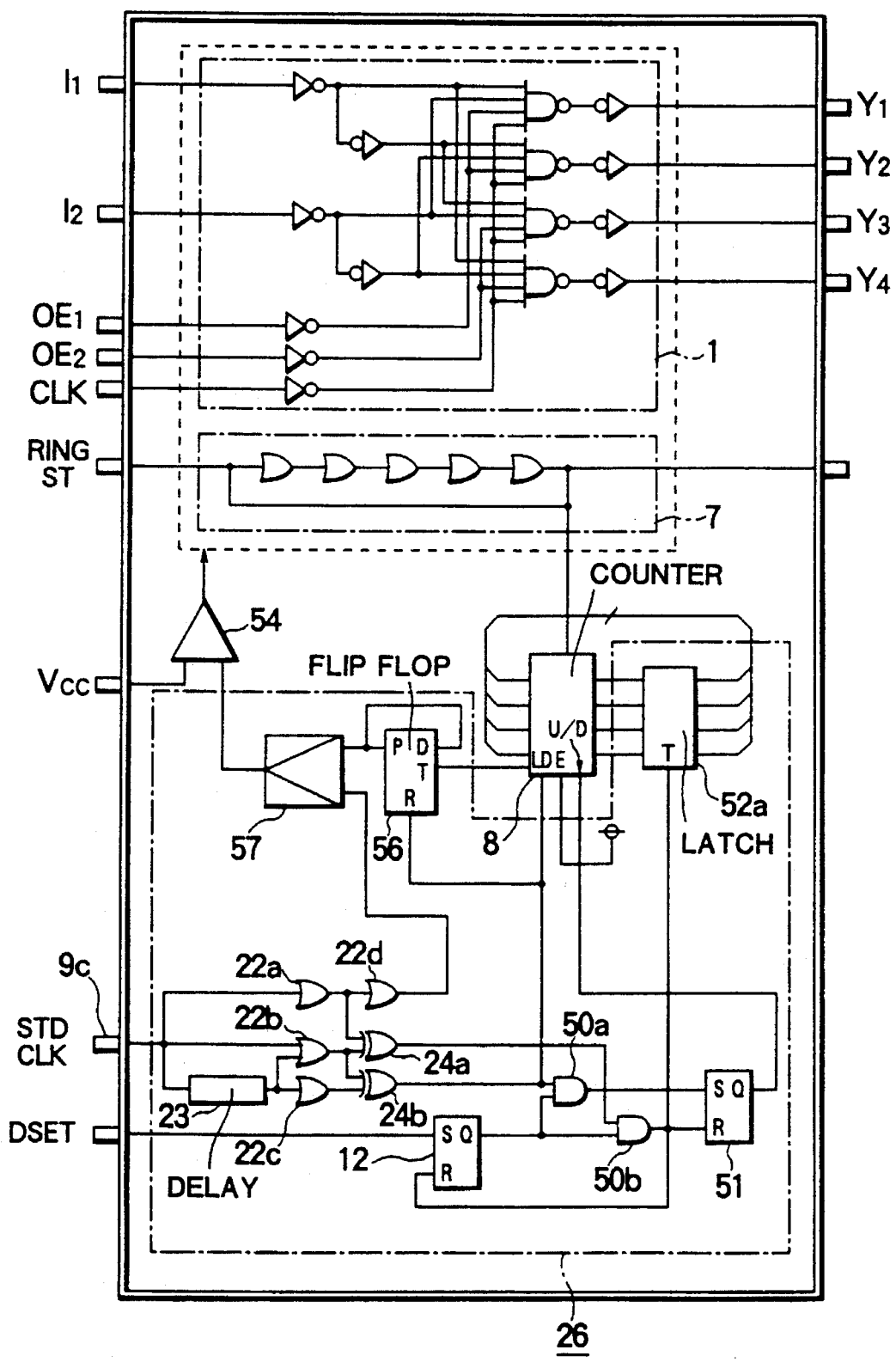
FIG. 11 is a block diagram illustrating a semiconductor integrated circuit according to a seventh embodiment of the present invention.

Referring to figures, a seventh embodiment according to the present invention will be described below. FIG. 11 is a block diagram illustrating still another embodiment according to the third aspect of the present invention. The elements corresponding to those in the previous embodiments will not be described again In FIG. 11, reference numeral 56 denotes a D flip-flop for generating a pulse based on the counting value of the up-and-down counter 8; and reference numeral 57 denotes a phase-locked loop (PLE) circuit which detects the phase difference between the STDCLK signal and the pulse generated by the flip-flop 56 and generates a compensation voltage corresponding to this phase difference.

Figure 12:
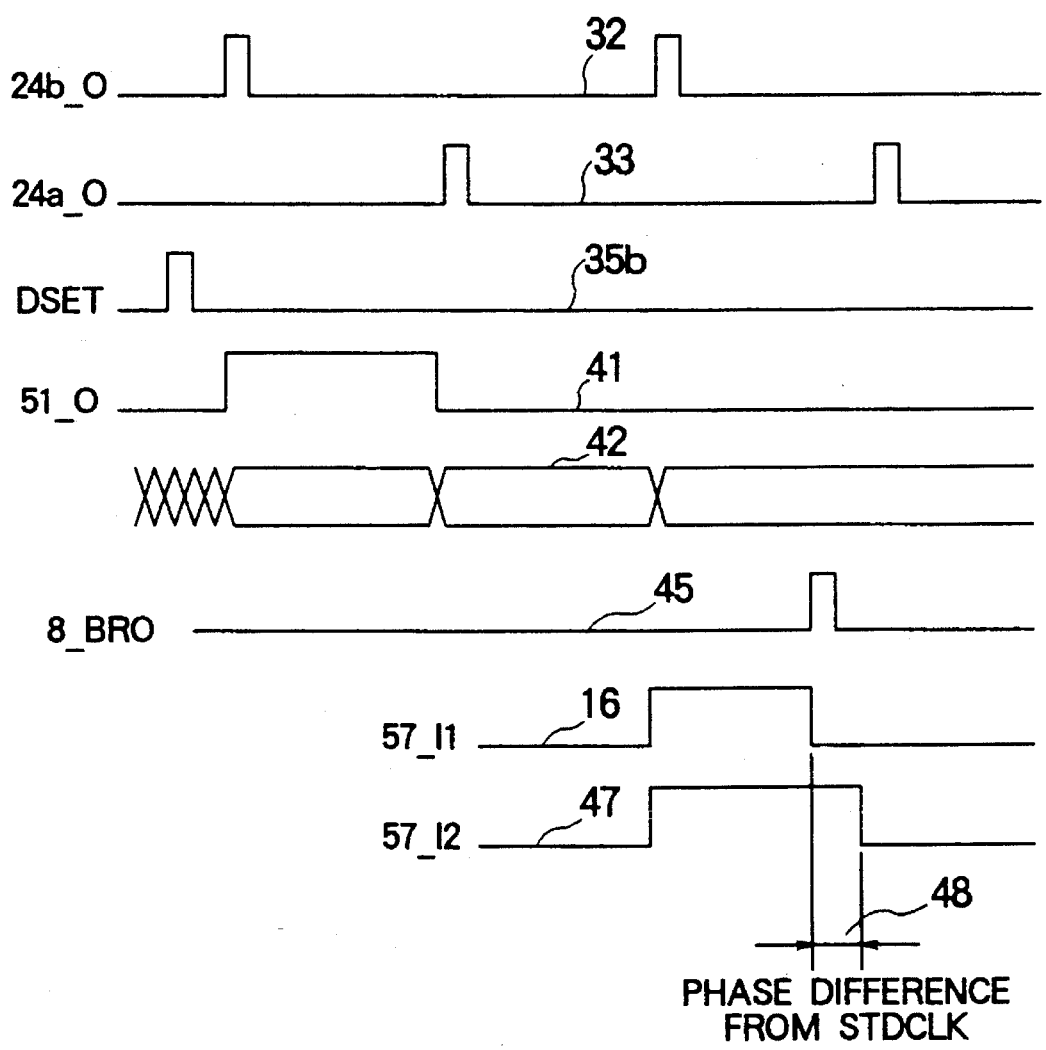
FIG. 12 is a timing chart showing the timing of the internal operations of the seventh embodiment.

In FIG. 12, reference numeral 45 denotes a borrow signal provided by the up-and-down counter 8; reference 46 denotes a pulse generated by the flip-flop 56; reference numeral 47 denotes a STDCLK signal applied to the input pin 9c; and reference numeral 48 denotes the phase difference between the pulse 47 generated by the flip-flop 56 and the STDCLK signal 47.

The operation of the embodiment will be described below. If the output of the EXCLUSIVE-OR gate 24b denoted by reference numeral 32 in FIG. 32 is applied to the reset terminal R of the flip-flop 56 at the rising edge of the STDCLK signal 47, then the inverted output P of the flip-flop 56 goes to a high level. When the up-and-down counter 8 outputs a borrow signal after completion of counting down, the signal 46 provided from the inverted output P of the flip-flop 56 goes to a low level. The PLL circuit 57 detracts the phase difference 48 between this signal 46 and the STDCLK signal 47, and provides a voltage corresponding to the phase difference 48 to the operational amplifier 54. Thus, this embodiment provides a similar operation to that in the case of Embodiment 5 or 6.

EMBODIMENT 8

Figure 13:
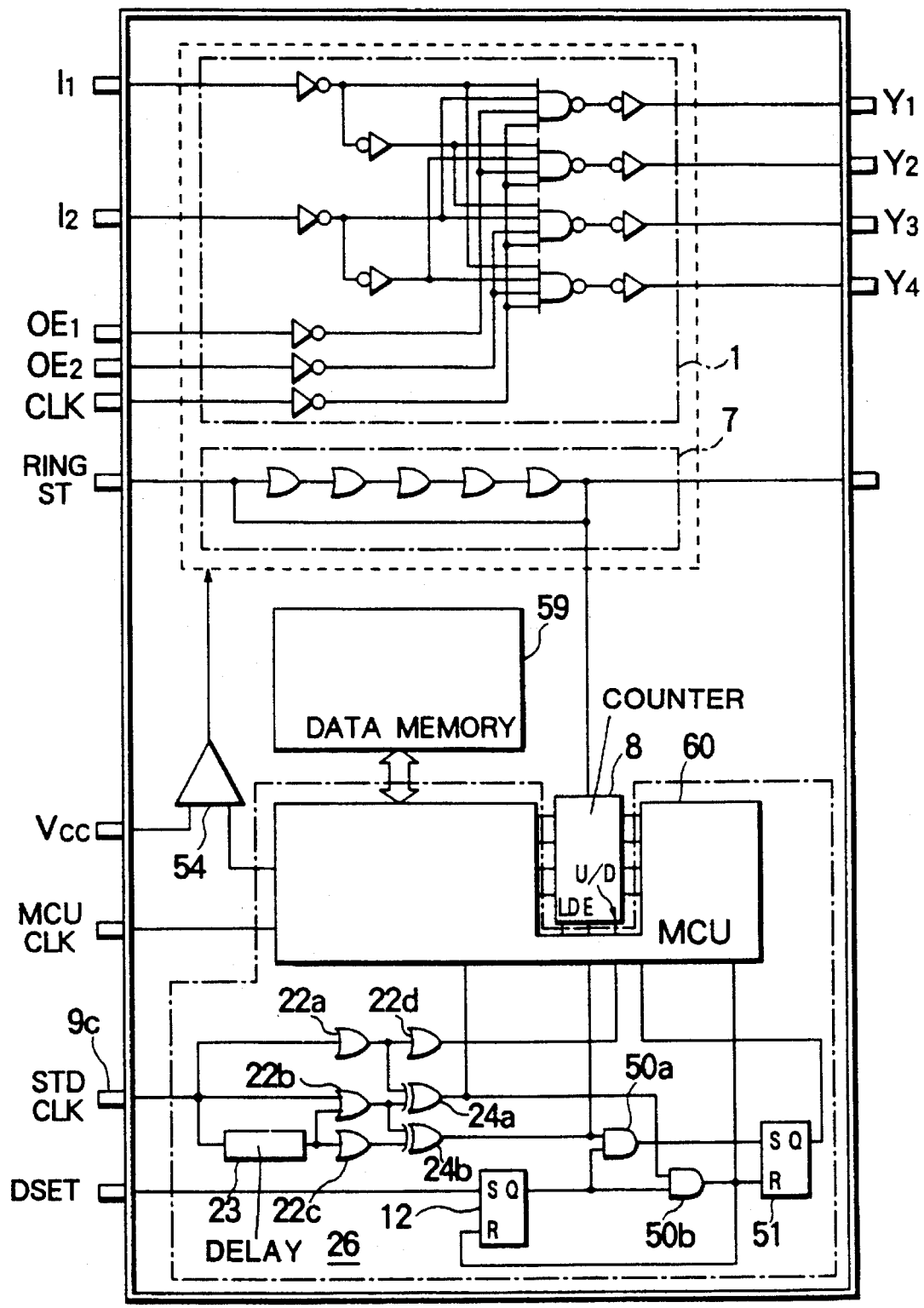
FIG. 13 is a block diagram illustrating a semiconductor integrated circuit according to an eighth embodiment of the present invention.

Now, an eighth embodiment according to the present invention will be described below. FIG. 13 is a block diagram illustrating an embodiment according to the fourth aspect of the present invention. The elements corresponding to those which have been already explained will not be described again. In FIG. 13, reference numeral 59 denotes data memory serving as memory means for storing status data and the reference counting value in the standard state, and for also storing status data and the counting value in the other states; and reference numeral 60 denotes an MCU such as M37702 which retrieves data from the memory 59 according to the difference between the counting value of the up-and-down counter 8 and the reference counting value and which generates a compensation voltage to be applied to the operational amplifier 54.

Figure 14:
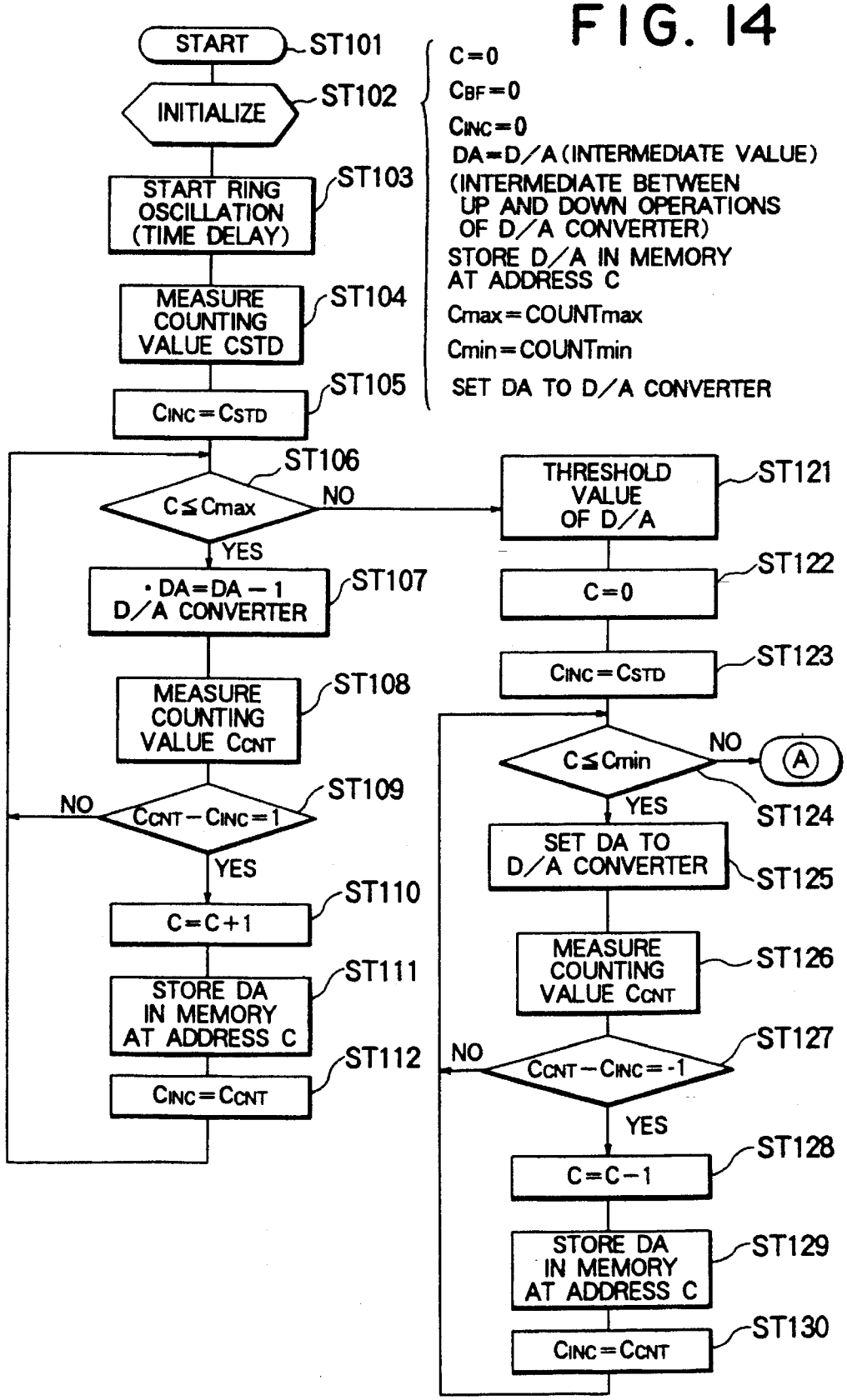
FIG. 14 is a flow chart illustrating the flow of the operations of the eighth embodiment.
Figure 15:
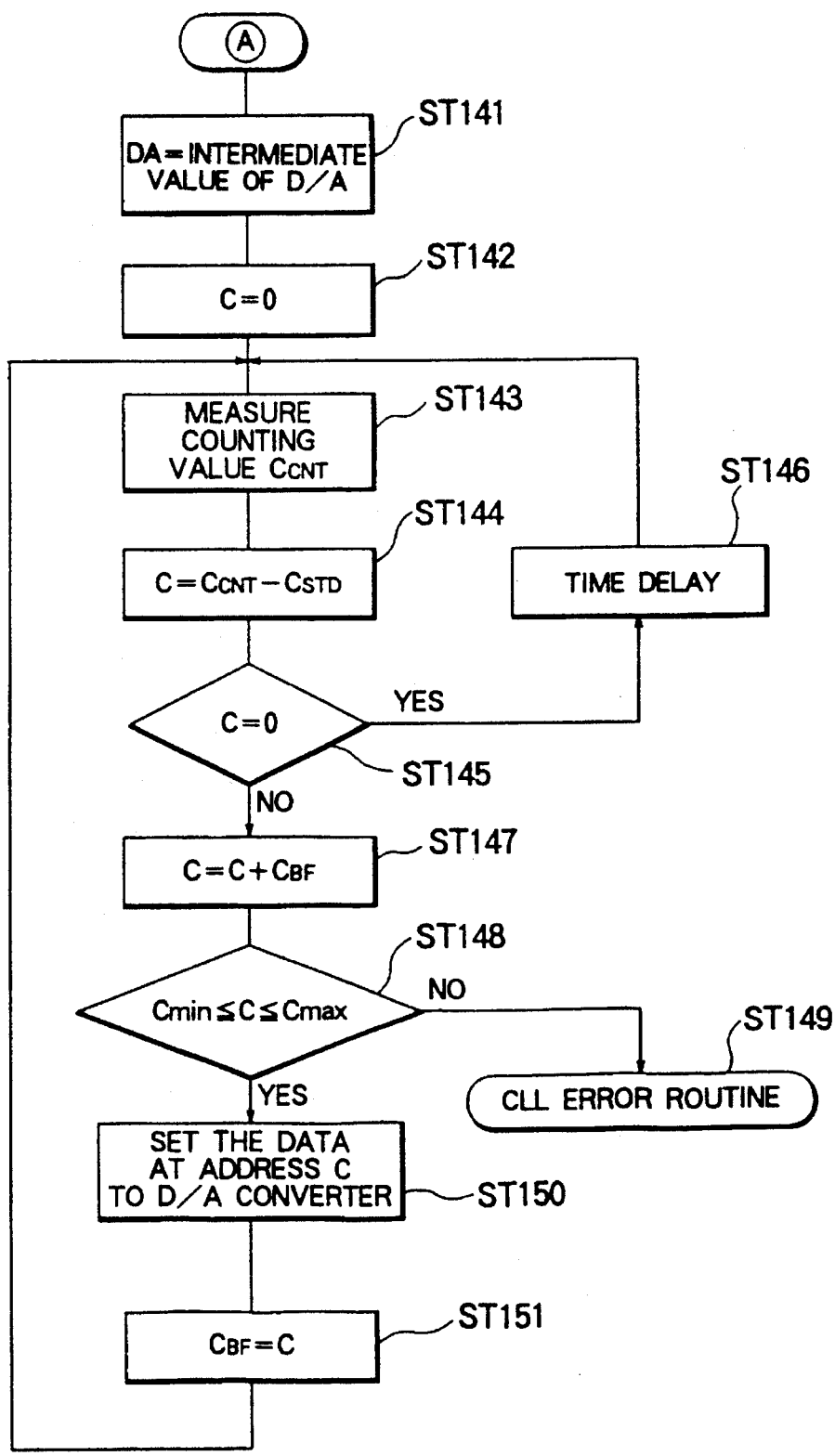
FIG. 15 is a flow chart illustrating the flow of the operations of the eighth embodiment.

The operation of this embodiment will be described below. FIGS. 14 and 15 are a flow chart illustrating a operation flow of the MCU 60. The operations associated with elements other than the MCU 60 and data memory 59 have been already explained in connection with Embodiments 1–7, and will not be described again.

In step ST102, the MCU initializes various parameters. Then, in step ST103, the MCU starts the ring oscillation of the ring oscillator 7, and waits for a certain time period until the entire circuit settles to a stable, i.e., standard operation state. In step ST104, the number of pulses generated by the ring oscillation is counted by the up-and-down counter 8 relative to the STDCLK signal applied via the input pin 9c. In step ST105, the counting value obtained in this way is stored as the reference counting value in the data memory 59. Then, in step ST107, the MCU 60 decrements by "1" the data of the D/A converter included in the MCU 60. In step ST105, the up-and-down counter 8 counts again the number of pulses of the ring oscillation. In step ST109, it is determined whether the above counted value is larger than the reference counting value by one. If no, then the operation returns to step ST106. If yes, then in step ST111, the data of the D/A converter at that time is stored in the data memory 59 at address C. Then, the operations described above are repeated and the data stored at address C is incremented each time. Eventually, optimum compensation values of the D/A converter corresponding to the differences in the counting value for the case where the measured counting values are larger than the reference counting value are prepared in the data memory 59.

Similarly, steps ST121–ST130 are executed repeatedly until the optimum compensation values of the D/A converter corresponding to the differences in the counting value for the case where the measured counting values are smaller than the reference counting value are prepared in the data memory 59.

After optimum compensation values of the D/A converter for the difference in the counting value have been prepared in the data memory 59, the number of pulses of the ring oscillation is counted in step ST143 in FIG. 15. If the number of pulses counted is the same as the reference counting number, then, after a certain time delay, the operation step returns to step ST143. If the number of pulses counted is different from the reference counting number, then, in step ST150, the optimum compensation value corresponding to the difference, which has been already prepared as described in connection with FIG. 14, is selected and is set in the built-in D/A converter. Then, the operation step returns to step ST143 in which the number of pulses of the ring oscillation will be counted again.

In this way, the operation shown in FIG. 15 is executed repeatedly, and the corresponding compensation voltage is applied to the operation amplifier 54 during each repetition, whereby the change in the internal delay of the CMOS or the like arising from a change in temperature or other reasons can be self-compensated. In step ST148 in the above operations, if it is determined that the, difference between the measured counting value and the reference counting value is larger than the maximum range available for the optimum compensation, then an error routine will be executed in step ST149.

EMBODIMENT 9

Figure 16:
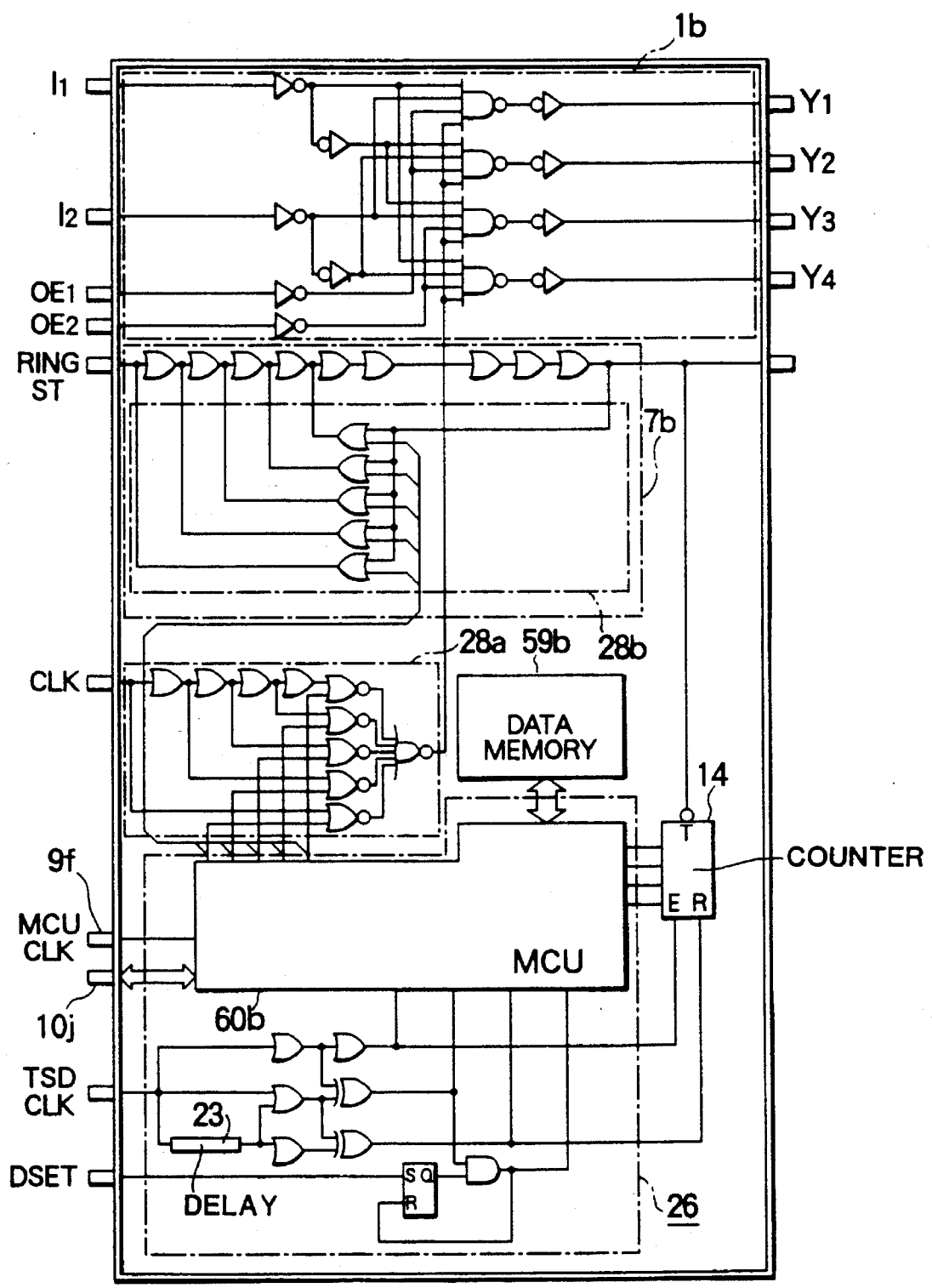
FIG. 16 is a block diagram illustrating a semiconductor integrated circuit according to a ninth embodiment of the present invention.

In the above Embodiment 8, the output of the MCU 60 serving as the retrieving means is applied to the operation amplifier 54 serving as the control circuit for controlling the power-supply voltage whereby the power-supply voltage is adjusted so as to control the delay time of the actual logic circuit portion 1 and also the delay time of the ring oscillator 7. Alternatively, the output of the retrieving means may also be applied to the synchronizing clock timing compensation circuit and to the oscillator delay control circuit so as to control the delay time of the actual logic circuit portion 1 and also the delay time of the ring oscillator 7. FIG. 16 is a block diagram of such, an embodiment according to the fifth aspect of the present invention. In this figure, there are shown a data memory 59b serving as memory means for storing the status data and the reference counting value in the standard state and for also storing the status data and the counting value in the other states; and an MCU 60b which retrieves data from the data memory 59 according to the difference between the counting value of the up-and-down counter 14 and the reference counting value and which generates a compensation voltage to be applied to the synchronizing clock timing compensation circuit 28a and to the oscillator delay control circuit 28b.

The MCU 60b operates in a similar manner to the MCU 60 in the above Embodiment 8 and provides the control data to the synchronizing clock timing compensation circuit 28a and also to the oscillator delay control circuit 28b so as to achieve the sell-compensation of the change in the internal time delay of the CMOS or the like arising from a change in temperature or other reasons.

EMBODIMENT 10

Figure 17:
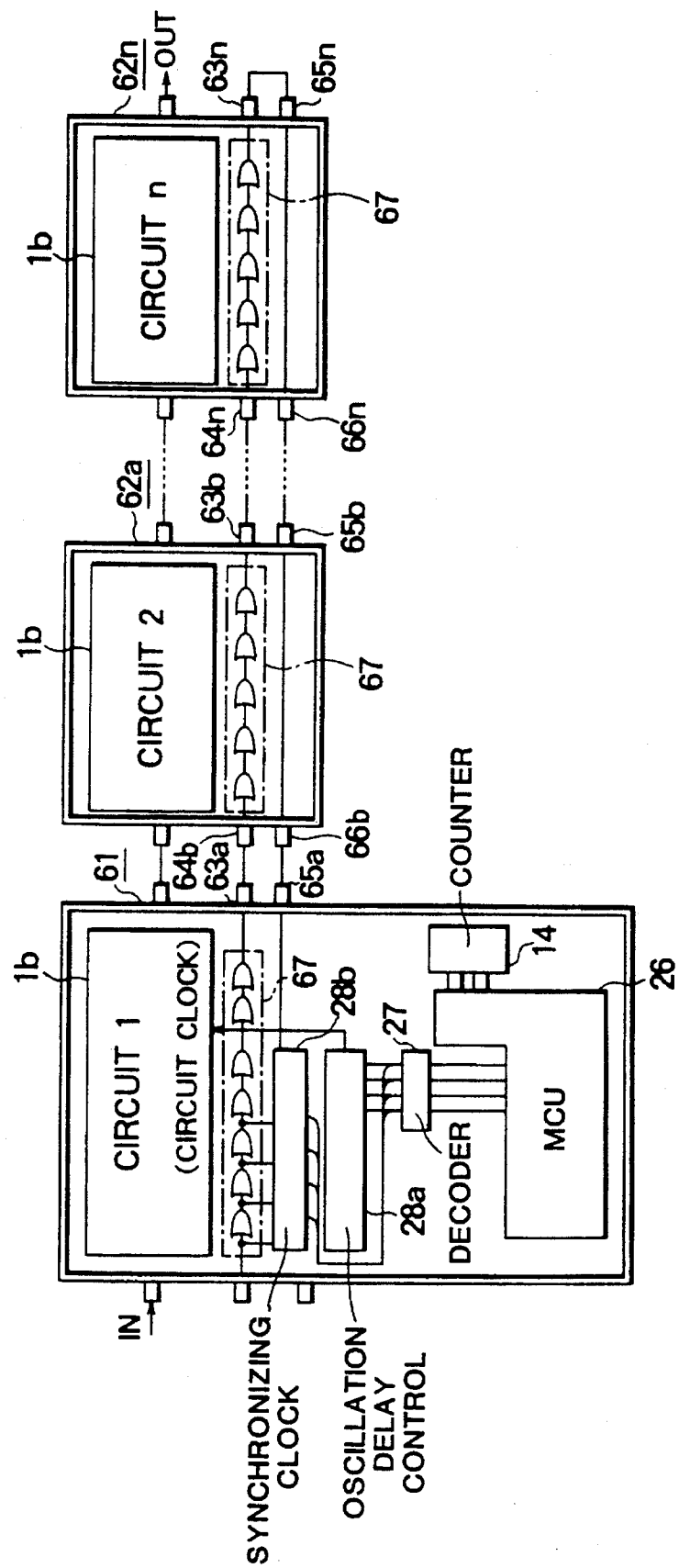
FIG. 17 is a block diagram illustrating a combination of semiconductor integrated circuits according to a tenth embodiment of the present invention.

Now, a tenth embodiment according to the present invention will be described below referring to the figures. FIG. 17 is a block diagram illustrating an embodiment according to the sixth aspect of the present invention. The elements corresponding to those which have been already explained will not be described. In FIG. 17, reference numeral 61 denotes a gate array similar to that in Embodiment 3 shown in FIG. 3. The difference is that in this embodiment 10 there are provided input and output pins for the portions to be used to form the ring oscillator. Reference numerals 62a–62n denote gate arrays which have only an actual logic circuit portion 1b and a ring oscillator. The logic circuits of the actual logic circuit portions 1b of these gate arrays 62a–62n are cascaded. Each portion for the ring oscillator has input and output pins, that is, dummy gate output pins 63a–63n to be used for the connection to form the ring oscillator, dummy gate input pins 64a–64n, feedback input pins 65a–65n to be used to form the feedback path of the ring oscillator, and feedback output pins 66a–66n. Each portion for the ring oscillator also has a plurality of dummy gates 67 connected to each other in series. These dummy gates are to be connected to each other in the form of a ring via the above input and output pins 63a–66n such that the ring oscillator may be formed.

The operation of this embodiment is as follows. As shown in FIG. 17, the series of dummy gates 67 of the gate arrays 61, and 62a–62n are connected to each other in such a manner that the dummy gate output in 63a is connected to the dummy gate input pin 64a, and the dummy gate output pin 63b is connected to the dummy gate input pin 64b. In a similar manner, the other input pins are connected in sequence to the corresponding output pins, and finally, the dummy gate output pins 63n is connected to the feedback input pin 65n. Then, the feedback input pin 65a is connected is connected to the feedback output pin 66a, and the feedback input pin 65b is connected to the feedback output pin 66b. The other feedback input pins are connected to the corresponding feedback output pins in a similar manner. In this way, all the series of dummy gates 67 of the gate arrays 61 and 62a–62n are connected in the form of a ring to form a ring oscillator. In this state, ring oscillation is forced to occur. Based on the number of pulses of the ring oscillation, a delay time compensation control circuit 26 controls the synchronizing clock timing compensation circuit 28a and the oscillator delay control circuit 28b so as to compensate the change in the total propagation delay time of the actual logic circuit portions 1b of the gate arrays 61 and 62a–62n. The operation for the compensation is similar to that in Embodiment 3, and will not be described again.

EMBODIMENT 11

Figure 18:
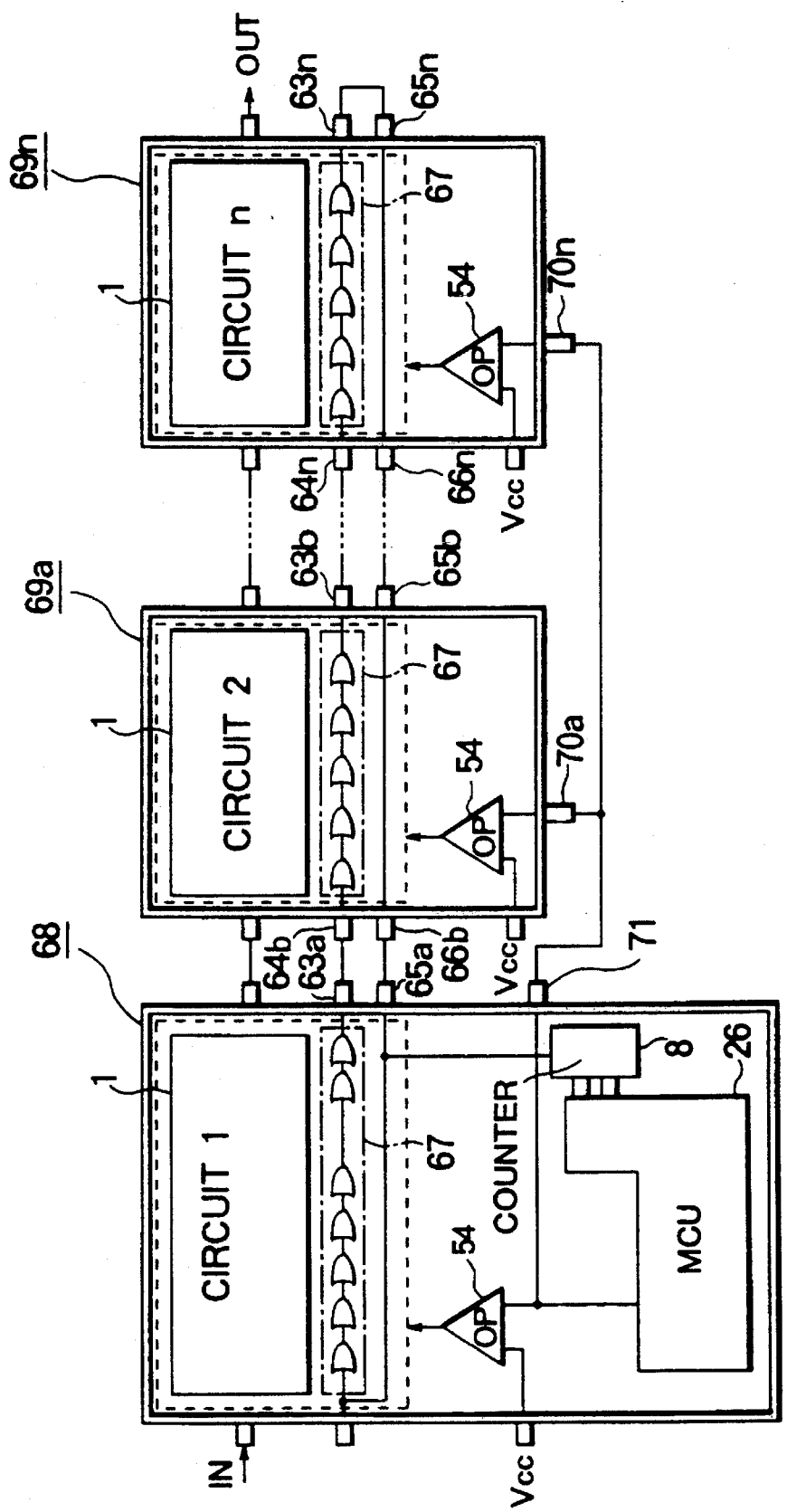
FIG. 18 is a block diagram illustrating a combination of semiconductor integrated circuits according to an eleventh embodiment of the present invention.

Referring to figures, an eleventh embodiment according to the present invention will be described below. FIG. 18 is a block diagram illustrating an embodiment according to the seventh aspect of the .present invention. The elements corresponding to those which have been already explained will be not be described again. In FIG. 18, reference numeral 68 denotes a gate similar array to that in Embodiment 5 with a slight difference in that there are provided input and output pins for the portion to be used to form a ring oscillator. Reference numerals 69a–69n denote gate arrays which have only an actual logic circuit portion 1, a series of dummy gates 67, and an operational amplifier 54 serving as a control circuit for controlling the power-supply voltage Vcc whereby the change in the delay time is compensated. The logic circuits of the actual logic circuit portions 1 of these gate arrays 68, and 69a–69n are connected in series. The series of dummy gates 67 are also connected in the form of a ring via the input and output pins 63a–63n, 64a–64n, 65a–65n , and 66a–66n. Reference numerals 70a–70n denote input pins via which the compensation voltage is applied to the operational amplifiers 54 of the gate arrays 69a–69n. Reference numeral 71 denotes an output pin via which the compensation voltage is provided by the gate array 68.

The operation of this embodiment will be described below. As in the tenth embodiment, the series of dummy gates 67 are connected in the form of a ring to form a ring oscillator. The delay time compensation control circuit 26 generates a compensation voltage corresponding to the number of pulses of the ring oscillation, which is performed in a similar manner to that in Embodiment 5 shown in FIG. 8. This compensation voltage is output via the output pin 71 of the gate array 68, and is applied via the input pins 70a–70n to the operational amplifier 54 of the gate arrays 69a–69n. The operational amplifiers 54 add the compensation voltage to the power-supply voltage Vcc. In each gate array 68, and 69a–69n, the output voltage of the operational amplifier 54 is employed as the power-supply voltage for the actual logic circuit portion 1 and for the series of dummy gates 67. In this way, the change in the total propagation delay time of the actual logic circuit portions 1 of the gate arrays 68, and 69a–69n is compensated.

EMBODIMENT 12

Figure 19:
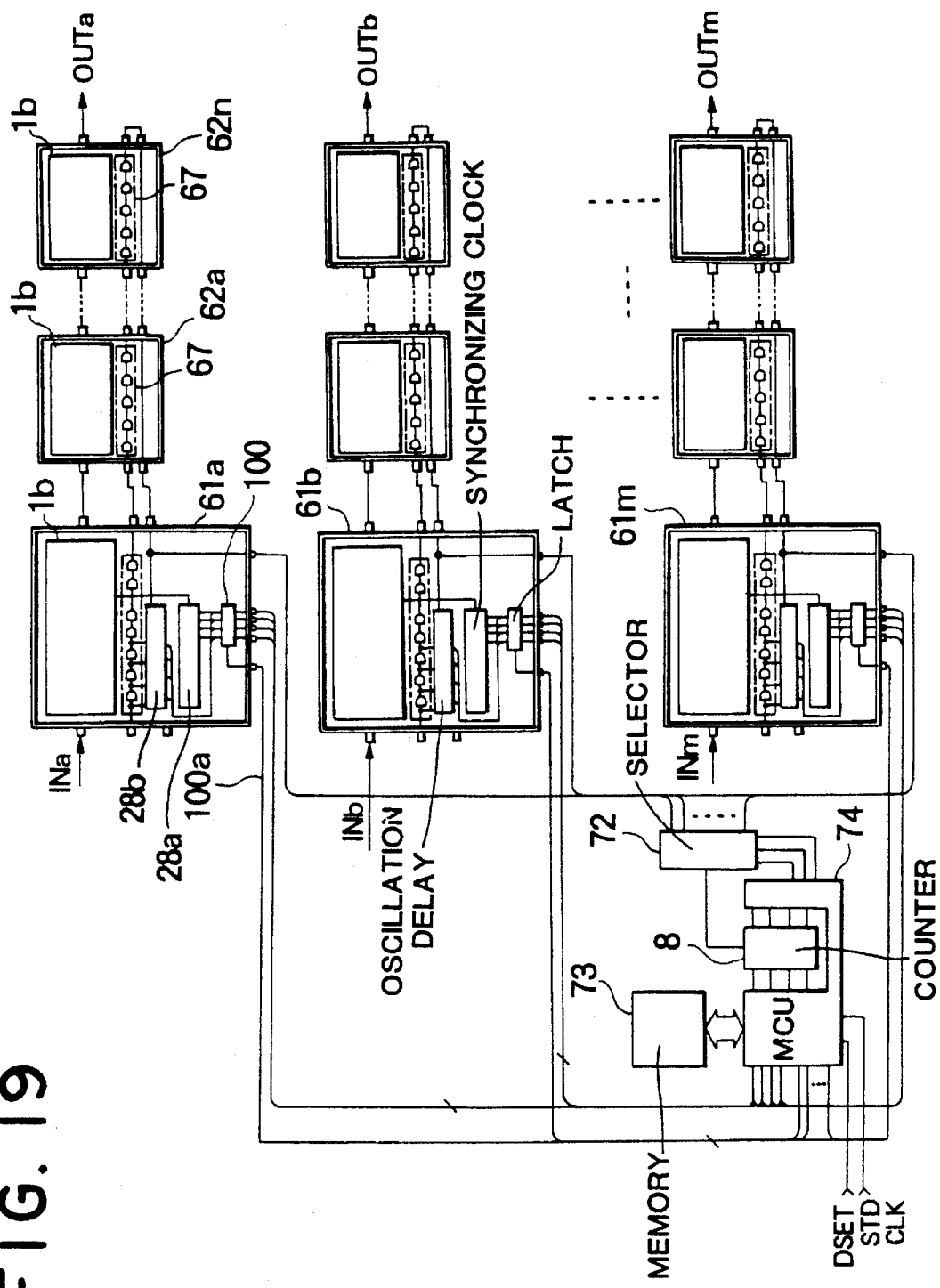
FIG. 19 is a block diagram illustrating a combination of semiconductor integrated circuits according to a twelfth embodiment of the present invention.

Referring to figures, a twelfth embodiment according to the present invention will be described below. FIG. 19 is a block diagram illustrating an embodiment according to the eighth aspect of the present invention. The elements corresponding to those which have been already explained will not be described again. In FIG. 19, reference numerals 61a–61m denote gate arrays which are similar to the gate array denoted by reference numeral 61 in FIG. 17 with a difference that the delay time compensation control circuit 26 and the up counter 14 are removed. Each one of these gate arrays 61a–61m together with the gate arrays 62a–62a form one channel, and the total system comprises m channels with the same configuration. Reference numeral 72 denotes a selector for selecting a pulse output from the outputs of the ring oscillators in the channels, wherein the ring oscillators are composed of the series of dummy gates 67. Reference numeral 73 denotes data memory serving as memory means which is extended from the data memory 59 in Embodiment 9 shown in FIG. 9 to, adapt to each channel. Reference numeral 74 denotes an MCU serving as a delay time compensation control circuit which retrieves data from the data memory 73 to generate control data, and which also performs other various data processing such as controlling the selector 72 and the distribution of the control data to each channel.

The operation of this embodiment will be described below. In each channel, the series of dummy gates 67 of gate arrays forms one ring oscillator. The oscillating pulses of the ring oscillators of respective channels are applied to the selector 72. Under the control of the MCU 74, the selector 72 successively selects one channel at a time so that the oscillating pulses may be applied to the up-and-down counter 8. Based on the counting value provided by the up-and-down counter 8, the MCU 74 retrieves the data memory 73, and transmits the control data and the code signals identifying the channels to respective channels. Each of gate arrays 61a–61m has a latch 100 for latching the received control data responsive to the code signal 100a acting as a trigger signal. If each channel receives the control data having the code corresponding to the channel, the synchronizing clock timing compensation circuit 28a and the oscillator delay control circuit 28b are controlled to obtain the proper delay corresponding to the reference counting value. These operations are performed in a similar manner to that in Embodiment 3, which will not be described again.

EMBODIMENT 13

Figure 20:
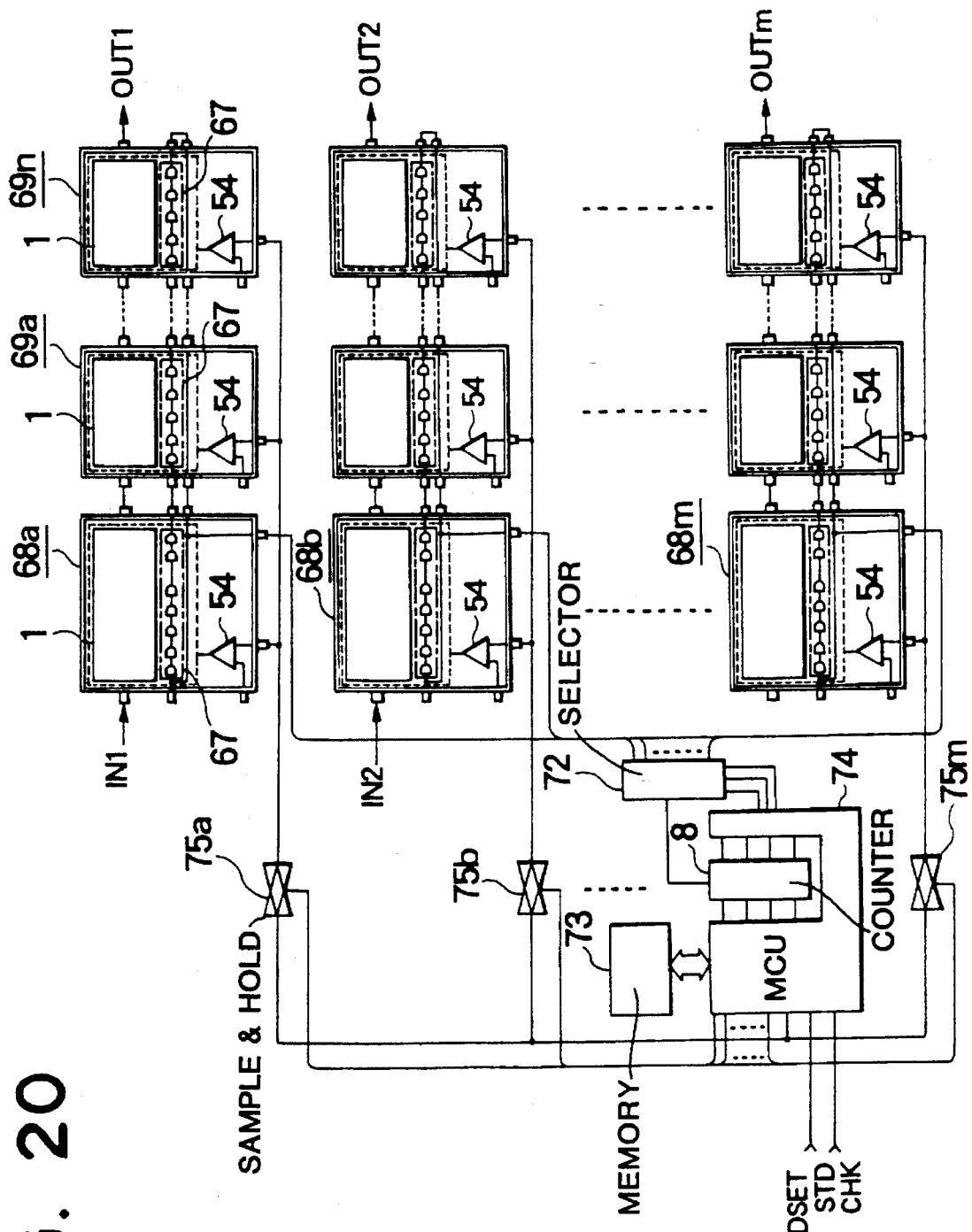
FIG. 20 is a block diagram illustrating a combination of semiconductor integrated circuits according to a thirteenth embodiment of the present invention.

Referring to figures, a thirteenth embodiment according to the present invention will be described below. FIG. 20 is a block diagram illustrating an embodiment according to the ninth aspect of the present invention. The elements corresponding to those which have been already explained will not be described again. In FIG. 20, reference numerals 68a–68m denote gate arrays which are similar to the gate array denoted by reference numeral 68 in FIG. 18 with a difference that the delay time compensation control circuit 26 and the up-and-down counter 8 are removed. Each one of these gate arrays 68a–65m together with the gate arrays 69a–69n form one channel, and the total system comprises m channels with the same configuration. Reference numeral 75a–75m denote sample-and-hold circuits serving as a transfer means for selectively supplying the compensation voltages, generated by the MCU 74 for respective channels, to corresponding channels.

The operation of this embodiment will be described below. As in the case of Embodiment 12, the oscillating pulses of the ring oscillators of respective channels are counted by the up-and-down counter 8, and based on the counting value provided by the up-and-down counter 8, the MCU 74 retrieves data from the memory 73, and generates the control data. From these control data, the MCU 74 generates the compensation voltages for respective channels, and then transmits these compensation voltages together with the sample-and-hold signals for identifying each channel to respective sample-and-hold circuits 75a–75m. In each channel, based on the given compensation voltage, it power-supply voltage control circuit 54 controls the power-supply voltage to obtain the proper delay corresponding to the reference counting value. These operations are performed in a similar manner to that in embodiment 5, which will not be described again.

In the above embodiments it has been described that the semiconductor integrated circuit is a gate array. However, the present invention is not limited to that. The present invention may be applied to any kind of integrated circuits by forming a ring oscillator with dummy devices which are substantially of the same kind as that in the actual logic circuit portion.

As described above, according to the first aspect of the present invention, counting means counts the oscillating pulses generated by a ring oscillator relative to the reference pulse signal, wherein the ring oscillator is composed of dummy device elements which are formed separately from an actually-used logic circuit portion. Thus, it becomes possible to realize a semiconductor integrated circuit in which the change in the propagation delay of the actually-used logic circuit portion arising from a change in temperature or other reasons can be detected from the above counted value.

According to the second aspect of the present invention, control data is generated based on the difference between a counting value of counting means and a reference counting value which is given as the first counting value counted by the counting means. This control data is provided to the synchronizing clock timing compensation circuit for compensating the change in propagation delay of the actually-used logic circuit portion of the clock synchronizing type, and is also provided to the oscillator delay control circuit for controlling the propagation delay of the ring oscillator. Thus, it becomes possible to realize a semiconductor integrated circuit which can self-compensate the change in the propagation delay of the actually-used logic circuit portion arising from a change in temperature or other reasons.

According to the third aspect of the present invention, a compensation voltage is generated based on the difference between a counting value of the counting means and a reference counting value which is given as the first counting value counted by the counting means. This compensation voltage is provided to the power-supply voltage control circuit for controlling the power-supply voltage for the actually-used logic circuit portion and the ring oscillator. Thus, it becomes possible to realize a semiconductor integrated circuit which can self-compensate the change in the propagation delay of the actually-used logic circuit portion arising from a change in temperature or other reasons.

According to the fourth aspect of the present invention, there is provided memory means for storing compensation data, which is retrieved to obtain the compensation voltage based on the result of comparison between the counting value of the counting means and the reference counting value. The obtained compensation voltage is provided to the power-supply voltage control circuit. Thus, it becomes possible to realize a semiconductor integrated circuit in which the optimum compensation value can be obtained taking into account the change of the state of the circuit.

According to the fifth aspect of the present invention, there is provided memory means for storing compensation data, which is retrieved to obtain the control data based on the result of comparison between the counting value of the counting means and the reference counting value. The obtained control data is provided to the synchronizing clock timing compensation circuit and the oscillator delay control circuit. Thus, it becomes possible to realize a semiconductor integrated circuit in which the optimum compensation value can be obtained taking into account a change of state.

According to the sixth aspect of the present invention, a plurality of semiconductor integrated circuits are connected in series, and the series of dummy device elements provided in the respective semiconductor integrated circuits are connected in the form of a ring to form a ring oscillator. There is also provided counting means for counting the oscillating pulses of the ring oscillator. The control data to be used to compensate the change in the propagation delay is generated based on the difference between the counting value of the counting means and the reference counting value which is given as the first counting value counted by the counting means. The obtained control data is provided to a synchronizing clock timing compensation circuit which is provided for common use by the plurality of semiconductor integrated circuits, and is also provided to the oscillator delay control circuit which is provided for common use by the plurality of semiconductor integrated circuits. Thus, it becomes possible to realize a combination circuit of semiconductor integrated circuits which can self-compensate the change in the propagation delay of the total circuit.

According to the seventh aspect of the present invention, a plurality of semiconductor integrated circuits are connected in series, and the series of dummy device elements provided in the respective semiconductor integrated circuits are connected in the form of a ring to form a ring oscillator. There is also provided counting means for counting the oscillating pulses of the ring oscillator. The compensation voltage to be used to compensate the change in the propagation delay is generated based on the difference between the counting value of the counting means and the reference counting value which is given as the first counting value counted by the counting means. The obtained compensation voltage is provided to the power-supply voltage control circuits of respective semiconductor integrated circuits. Thus, it becomes possible to realize a combination circuit of semiconductor integrated circuits which can self-compensate the change in the propagation delay of the total circuit.

According to the eighth aspect of the present invention, the combination circuit of semiconductor integrated circuits comprises a plurality of channels each of which comprises a combination circuit of integrated circuits according to the sixth aspect of the present invention; one counting means which is provided for common use by the plurality of channels; one memory means which is provided for common use by the plurality of channels; and one delay time compensation control circuit block which is provided for common use by the plurality of channel, wherein the delay time compensation control circuit block provides the control data to respective channels. Thus, it becomes possible to realize a combination of semiconductor integrated circuits which self compensates the change in the propagation delay for each channel and also the variations in the propagation delay among the channels.

According to the ninth aspect of the present invention, the combination circuit of semiconductor integrated circuits comprises a plurality of channels each of which comprises a combination circuit of integrated circuits according to the seventh aspect of the present invention; one counting means which is provided for common use by the plurality of channels; one memory means which is provided for common use by the plurality of channels; and one delay time compensation control circuit block which is provided for common use by the plurality of channels, wherein the compensation voltages generated by the delay time compensation control circuit block are transferred to respective channels via the corresponding transfer means. Thus, it becomes possible to realize a combination circuit of semiconductor integrated circuits which self-compensate the change in the propagation delay for each channel and the variations in the propagation delay among the channels.

What is claimed is:

1. A semiconductor integrated circuit comprising:

a clock-synchronized logic circuit having a signal propagation delay, said logic circuit for performing a predetermined logic operation and comprising a plurality of interconnected device elements;

a ring oscillator comprising a plurality of dummy device elements, said dummy device elements being connected in a ring, an applied pulse being circulated through said dummy device elements to generate oscillating pulses with a repetition time period corresponding to a delay time of said dummy device elements;

counting means connected to one of said dummy device elements for counting the oscillating pulses generated by said ring oscillator relative to a reference pulse signal;

a delay time compensation control circuit connected to said counting means for generating control data based on a difference between a count of said counting means and an initial count counted by said counting means when said integrated circuit first stabilizes after said ring oscillator begins oscillation;

a synchronizing clock timing compensation circuit connected to and receiving the control data from said delay time compensation control circuit for generating an output signal supplied to said logic circuit for compensating for a change in the signal propagation delay of said logic circuit; and an oscillation delay control circuit connected to and receiving the control data from said delay time compensation control circuit for generating an output signal coupled to said ring oscillator for controlling the delay time of said ring oscillator.

2. A semiconductor integrated circuit comprising:

a logic circuit having a signal propagation delay, said logic circuit for performing a predetermined logic operation and comprising a plurality of interconnected device elements;

a ring oscillator comprising a plurality of dummy device elements, said dummy device elements being connected in a ring,, an applied pulse being circulated through said dummy device elements to generate oscillating pulses with a repetition time period corresponding to a delay time of said dummy device elements;

counting means connected to one of said dummy device elements for counting the oscillating pulses generated by said ring oscillator relative to a reference pulse signal;

a delay time compensation control circuit connected to said counting means for generating a compensation voltage based on a difference between a count of said counting means and an initial count counted by said counting means when said integrated circuit first stabilizes after said ring oscillator begins oscillation; and a power-supply voltage control circuit connected to and receiving the compensation voltage from said delay time compensation control circuit for controlling a power-supply voltage applied to said logic circuit and said ring oscillator to compensate for a change in the propagation delay of said logic circuit.

3. A combination of semiconductor integrated circuits comprising:

a plurality of semiconductor integrated circuits, each of said semiconductor integrated circuits comprising:

a clock-synchronized logic circuit having a signal propagation delay, said logic circuit for performing a predetermined logic operation and comprising a plurality of interconnected device elements, and a plurality of dummy device elements connected in series, wherein said logic circuits of said plurality of semiconductor integrated circuits are connected in series and said plurality of dummy device elements of said plurality of semiconductor integrated circuits are connected in a ring to form a ring oscillator, an applied pulse being circulated through said dummy device elements to generate oscillating pulses with a repetition timing period corresponding to a delay time of said dummy device elements;

said combination of semiconductor integrated circuits further including:

a single counting means for said plurality of semiconductor integrated circuits connected to one of said dummy device elements for counting the oscillating pulses generated by said ring oscillator relative to a reference pulse signal, a single delay time compensation control circuit for said plurality of semiconductor integrated circuits connected to said counting means for supplying control data based on a difference between a count of said counting means and an initial count counted by said counting means when said integrated circuit first stabilizes after said ring oscillator begins oscillation, a single synchronizing clock timing compensation circuit for said plurality of semiconductor integrated circuits connected to and receiving the control data from said delay time compensation control circuit for generating an output signal supplied to one of said logic circuits for compensating for a change in the signal propagation delay of said logic circuits, and a single oscillation delay control circuit for said plurality of semiconductor integrated circuits connected to and receiving the control data from said delay time compensation control circuit for generating an output signal coupled to said ring oscillator for controlling the delay time of said ring oscillator.

4. A combination of semiconductor integrated circuits comprising:

a plurality of semiconductor integrated circuits, each of said semiconductor integrated circuits comprising:

a clock-synchronized logic circuit having a signal propagation delay, said logic circuit for performing a predetermined logic operation and comprising a plurality of interconnected device elements, a plurality of dummy device elements connected in series, and a power-supply voltage control circuit for controlling a power-supply voltage applied to said logic circuit and said plurality of dummy device elements, wherein said logic circuits of said plurality of semiconductor integrated circuits are connected in series and said plurality of dummy device elements of said plurality of semiconductor integrated circuits are connected in a ring to form a ring oscillator, an applied pulse being circulated through said dummy device elements to generate oscillating pulses with a repetition timing period corresponding to a delay time of said dummy device elements;

said combination of semiconductor integrated circuits further including:

a single counting means for said plurality of semiconductor integrated circuits connected to one of said dummy device elements for counting the oscillating pulses generated by said ring oscillator relative to a reference pulse signal, and a single delay time compensation control circuit connected to said counting means for supplying a control voltage to said power-supply voltage control circuits of said plurality of semiconductor integrated circuits for compensating for a change in the signal propagation delay of said logic circuits, the control voltage being generated based on a difference between a count of said counting means and an initial count counted by said counting means when said integrated circuit first stabilizes after said ring oscillator begins oscillation.

5. A combination of semiconductor integrated circuits comprising:

a plurality of channels, each of said channels comprising:

a plurality of clock-synchronized integrated circuits including:

logic circuits having respective signal propagation delays, each of said logic circuits for performing a predetermined logic operation and comprising a plurality of interconnected device elements, said logic circuits being connected in series, and a plurality of dummy device elements connected in a ring to form a ring oscillator, an applied pulse being circulated through said dummy device elements to generate oscillating pulses with a repetition time period corresponding to a delay time of said dummy device elements, a single synchronizing clock timing compensation circuit for generating an output signal supplied to one of said logic circuits in each channel for compensating for a change in the signal propagation delay of said logic circuits, and a single oscillator delay control circuit for said plurality of integrated circuits for generating an output signal coupled to said ring oscillator for controlling the delay time of said ring oscillator;

wherein said combination of semiconductor integrated circuits further includes:

a single counting means for said plurality of channels, said single counting means being connected for counting oscillating pulses generated by said ring oscillator of each channel relative to a reference pulse signal for each channel, a single memory means for said plurality of channels, said single memory means for storing compensation data for each of said plurality of channels, a single delay time compensation control circuit for said plurality of channels connected to said memory means and to said counting means for providing control data to said synchronizing clock timing compensation circuit and said oscillator delay control circuit for each channel, the control data being produced by retrieving compensation data from said memory means based on a count of said counting means, and selector means connected to said counting means, said delay time compensation control circuit, and said channels for selectively connecting respective channels to said counting means and said delay time compensation control circuit.

6. A combination of semiconductor integrated circuits comprising:

a plurality of channels, each of said plurality of channels comprising:

a plurality of integrated circuits including:

logic circuits having respective signal propagation delays, each of said logic circuits for performing a predetermined logic operation and comprising a plurality of interconnected device elements, said logic circuits being connected in series, a plurality of dummy device elements connected in a ring to form a ring oscillator, an applied pulse being circulated through said dummy device elements to generate oscillating pulses with a repetition time period corresponding to a delay time of said dummy device elements, and a respective power-supply voltage control circuit for each of said logic circuits for controlling a power-supply voltage supplied to said logic circuits and corresponding dummy device elements;

wherein said combination of semiconductor integrated circuits further includes:

a single counting means for said plurality of channels, said single counting means being connected for counting oscillating pulses generated by said ring oscillator of each channel relative to a reference pulse signal for each channel, a single memory means for said plurality of channels for storing compensation data for each of said plurality of channels, a single delay time compensation control circuit for said plurality of channels connected to said memory means and to said counting means for generating compensation voltages provided to respective power-supply voltage control circuits of channels to compensate for a change in the propagation delay of said logic circuits, the compensation voltages being generated by retrieving compensation data from said memory means based on a count of said counting means, and transfer means connected to said counting means, said delay time compensation control circuit, and said channels for selectively transferring the compensation voltages generated by said delay time compensation control circuit to corresponding channels.

7. A semiconductor integrated circuit comprises:

a logic circuit having a signal propagation delay, said logic circuit for perforating a predetermined logic operation comprising a plurality of interconnected device elements;

a ring oscillator comprising a plurality of dummy device elements, said dummy device elements being connected in a ring, an applied pulse being circulated through said dummy device elements to generate oscillating pulses with a repetition time period corresponding to a delay time of said dummy device elements;

counting means connected to one of said dummy device elements for counting the oscillating pulses generated by said ring oscillator relative to a reference pulse signal;

memory means for storing data indicating a stable state of stable oscillation of said ring oscillator, an initial count counted by said counting means when said integrated circuit first stabilizes after said ring oscillator begins oscillation, and status data representing states other than the stable state, said memory means storing, as compensation data, counts provided by said counting means in states other than the stable state;

a delay time compensation control circuit connected to said memory means for generating a compensation voltage determined by retrieving compensation data from said memory means based on a difference between a count of said counting means and the initial count; and a power-supply voltage control circuit connected to and receiving the compensation voltage from said delay time compensation control circuit for controlling a power supply voltage applied to said logic circuit and said ring oscillator to compensate for a change in the signal propagation delay of said logic circuit.

8. A semiconductor integrated circuit comprises:

a logic circuit having a signal propagation delay, said logic circuit for performing a predetermined logic operation and comprising a plurality of interconnected device elements;

a ring oscillator comprising a plurality of dummy device elements, said dummy device elements being connected in a ring, an applied pulse being circulated through said dummy device elements to generate oscillating pulses with a repetition time period corresponding to a delay time of said dummy device elements;

counting means connected to one of said dummy device elements for counting the oscillating pulses generated by said ring oscillator relative to a reference pulse signal;

memory means for storing data indicating a stable state of stable oscillation of said ring oscillator, an initial count counted by said counting means when said integrated circuit first stabilizes after said ring oscillator begins oscillation, and status data representing states other than the stable state, said memory means storing, as compensation data, counts provided by said counting means in states other than the stable state;

a delay time compensation control circuit connected to said counting means for generating a compensation voltage determined by retrieving compensation data from said memory means based on a difference between the count of said counting means and the initial count;

a synchronizing clock timing compensation circuit connected to and receiving the compensation voltage from said delay time compensation control circuit for generating an output signal supplied to said logic circuit for compensating for a change in the signal propagation delay of said logic circuit; and an oscillation delay control circuit connected to and receiving the compensation voltage from said delay time compensation control circuit for generating an output signal coupled to said ring oscillator for controlling the delay time of said ring oscillator.

* * * * *

UNITED STATES PATENT AND TRADEMARK OFFICE
CERTIFICATE OF CORRECTION

PATENT NO. : 5,485,114
DATED : January 16, 1996
INVENTOR(S) : Funakura et al.

It is certified that error appears in the above-indentified patent and that said Letters Patent is hereby corrected as shown below:

Column 20, Line 51, change ",," to --,--;

Column 23, Line 54, change "perforating" to

--performing--.

Signed and Sealed this

Sixteenth Day of July, 1996

Attest:

BRUCE LEHMAN

Attesting Officer                 Commissioner of Patents and Trademarks